United States Patent
(12) United States Patent
Yoo et al.

(10) Patent No.: US 12,718,716 B2
(45) Date of Patent: Aug. 25, 2026

(54) RELEASE FILM AND HOLE INSPECTION METHOD USING THE SAME

(71) Applicant: SAMSUNG DISPLAY CO., LTD., Yongin-si (KR)

(72) Inventors: Bugyoon Yoo, Hwaseong-si (KR); Joonhyuk Jang, Seoul (KR); Hoseung Kang, Anyang-si (KR); Minseop Kim, Cheonan-si (KR); Yunjae Kim, Cheonan-si (KR); Munsik Ham, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 46 days.

(21) Appl. No.: 19/023,266

(22) Filed: Jan. 15, 2025

(65) Prior Publication Data

US 2025/0157364 A1 May 15, 2025

Related U.S. Application Data

(62) Division of application No. 17/303,022, filed on May 18, 2021, now Pat. No. 12,217,634.

(30) Foreign Application Priority Data

Aug. 19, 2020 (KR) ........................ 10-2020-0103868

(51) Int. Cl.

| | |
|---|---|
| ***G09F 9/30*** | (2006.01) |
| ***H10K 59/80*** | (2023.01) |
| ***H10K 77/10*** | (2023.01) |
| ***H10K 102/00*** | (2023.01) |

(52) U.S. Cl.

CPC ........... *G09F 9/301* (2013.01); *H10K 59/873* (2023.02); *H10K 77/111* (2023.02); *H10K 2102/311* (2023.02)

(58) Field of Classification Search

CPC . G06F 1/1652; G09F 9/301; H10K 2102/311; H10K 59/873; H10K 77/111; H04M 1/0214; H04M 1/0268; Y02E 10/549

See application file for complete search history.

(56) References Cited

U.S. PATENT DOCUMENTS

| | | | | |
|---|---|---|---|---|
| 5,238,272 | A | 8/1993 | Taylor | |
| 6,423,390 | B1 | 7/2002 | Harden | |
| 10,777,769 | B2 | 9/2020 | Choi et al. | |
| 12,217,634 | B2 * | 2/2025 | Yoo | G09F 9/301 |
| 2002/0134497 | A1 | 9/2002 | Roth | |

(Continued)

FOREIGN PATENT DOCUMENTS

| | | | |
|---|---|---|---|
| KR | 10-2019-0028617 | A | 3/2019 |
| KR | 10-2020-0034264 | A | 3/2020 |
| KR | 10-2020-0059963 | A | 5/2020 |

*Primary Examiner* — Sonya M Sengupta

(74) *Attorney, Agent, or Firm* — Womble Bond Dickinson (US) LLP

(57) ABSTRACT

A release film includes: a first release film; and a second release film below the first release film, wherein the second release film comprises: a first sub release film below the first release film; and a second sub release film below the first sub release film and comprising a first portion and a second portion around the first portion, wherein the first portion is attached to and detached from the first sub release film.

4 Claims, 26 Drawing Sheets

(56) References Cited

U.S. PATENT DOCUMENTS

| | | | | |
|---|---|---|---|---|
| 2006/0262405 | A1 | 11/2006 | Brumwell | |
| 2013/0048203 | A1 | 2/2013 | Yau et al. | |
| 2019/0079233 | A1 | 3/2019 | Wang et al. | |
| 2019/0081274 | A1 | 3/2019 | Choi et al. | |
| 2025/0157364 | A1* | 5/2025 | Yoo | G09F 9/301 |

* cited by examiner

RFL
RFL1
FA
PLT1
OP
COV
OS1
PLT2
OS2
SUP
CUL
OS3
INL
OS4
BAD
INC2
INC1
RFL2_1
OS5
RFL2_2
OS6
RFL2
OS7
RFL3
DR1
DR2
DR3

RELEASE FILM AND HOLE INSPECTION METHOD USING THE SAME

CROSS-REFERENCE TO RELATED APPLICATIONS

This application is a divisional of U.S. patent application Ser. No. 17/303,022, filed May 18, 2021, which claims priority to and the benefit of Korean Patent Application No. 10-2020-0103868, filed Aug. 19, 2020, the entire content of both of which is incorporated herein by reference.

BACKGROUND

1. Field

Aspects of some example embodiments of the present disclosure herein relate to a release film and a hole inspection method using the same.

2. Description of Related Art

In general, a display device includes a display module for displaying images and a support for supporting the display module. The display module includes a display panel that displays images, a window located on the display panel to protect the display panel from external scratches and impacts, and a cover layer located below the display panel to protect the display panel from external impacts. The support has rigidity greater than that of the display module and supports the display module. The support comprises a support plate including a metal.

Recently, a display device including a flexible display panel has been developed with the development of display devices. Among the flexible display modules, a support located below the display module that is folded with respect to a foxing axis has a structure that is folded together with the display module.

The above information disclosed in this Background section is only for enhancement of understanding of the background and therefore the information discussed in this Background section does not necessarily constitute prior art.

SUMMARY

Aspects of some example embodiments of the present disclosure include a release film that is capable of protecting a support and more easily performing a process of manufacturing a display device and a hole inspection method using the same.

Aspects of some example embodiments of the inventive concept include a release film including: a first release film and a second release film below the first release film, wherein the second release film includes: a first sub release film below the first release film; and a second sub release film below the first sub release film and comprising a first portion and a second portion around the first portion, wherein the first portion is attached to and detached from the first sub release film.

According to some example embodiments of the inventive concept, a hole inspection method includes: arranging a second sub release film on a first sub release film, the second sub release film including a first portion and a second portion around the first portion, on a support; arranging the support on a display module; detaching the first portion, which overlaps a first hole defined in the display module and the support, from the first sub release film; arranging a camera on the first sub release film overlapping the first hole; and inspecting the first hole through the camera.

BRIEF DESCRIPTION OF THE DRAWINGS

The accompanying drawings are included to provide a further understanding of embodiments according to the inventive concept, and are incorporated in and constitute a part of this specification. The drawings illustrate aspects of some example embodiments of the inventive concept and, together with the description, serve to explain principles of embodiments according to the inventive concept. In the drawings.

DETAILED DESCRIPTION

Figure 1:
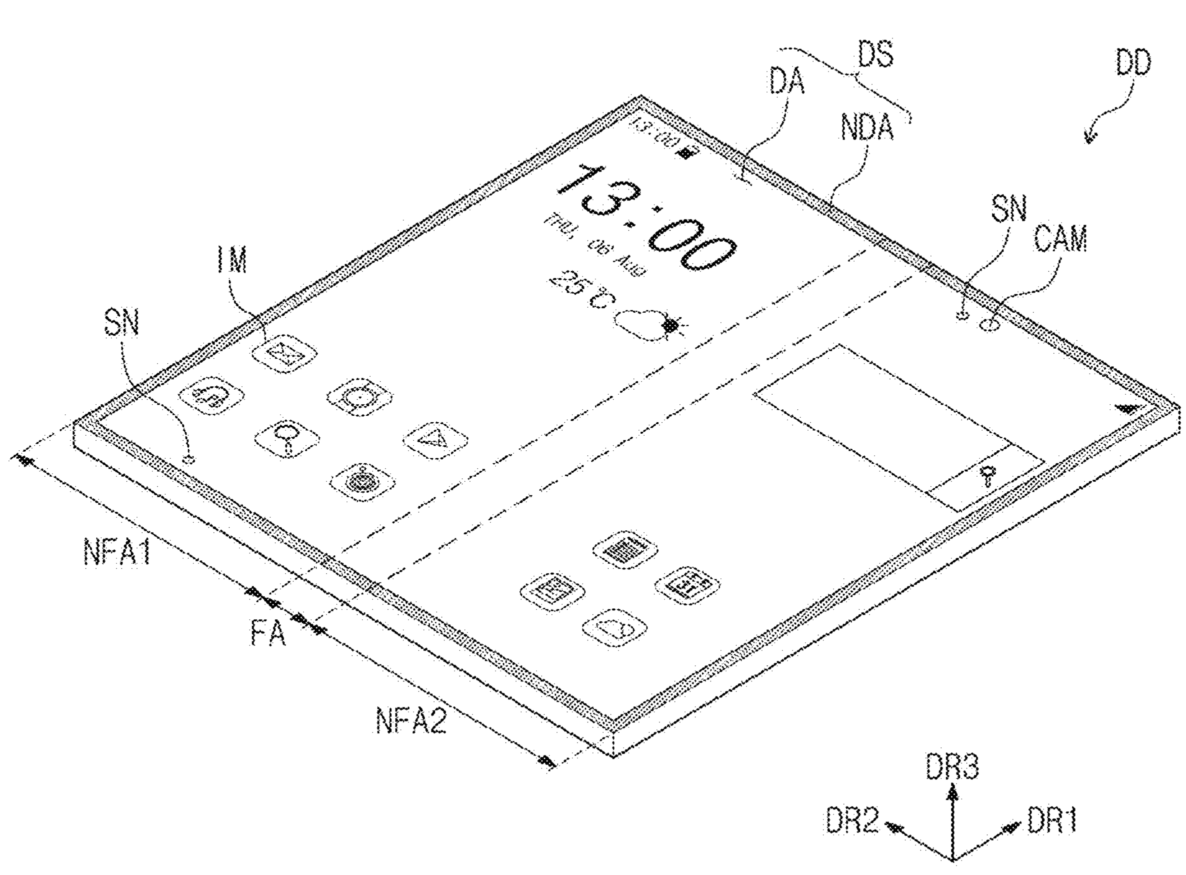
FIG. 1 is a perspective view of a display device manufactured using a support that is protected by a release film according to some example embodiments of the inventive concept.

In this specification, it will also be understood that when one component (or region, layer, portion) is referred to as being "on", "connected to", or "coupled to" another component, it can be directly located/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the inventive concept will be described in more detail with reference to the accompanying drawings.

Figure 2:
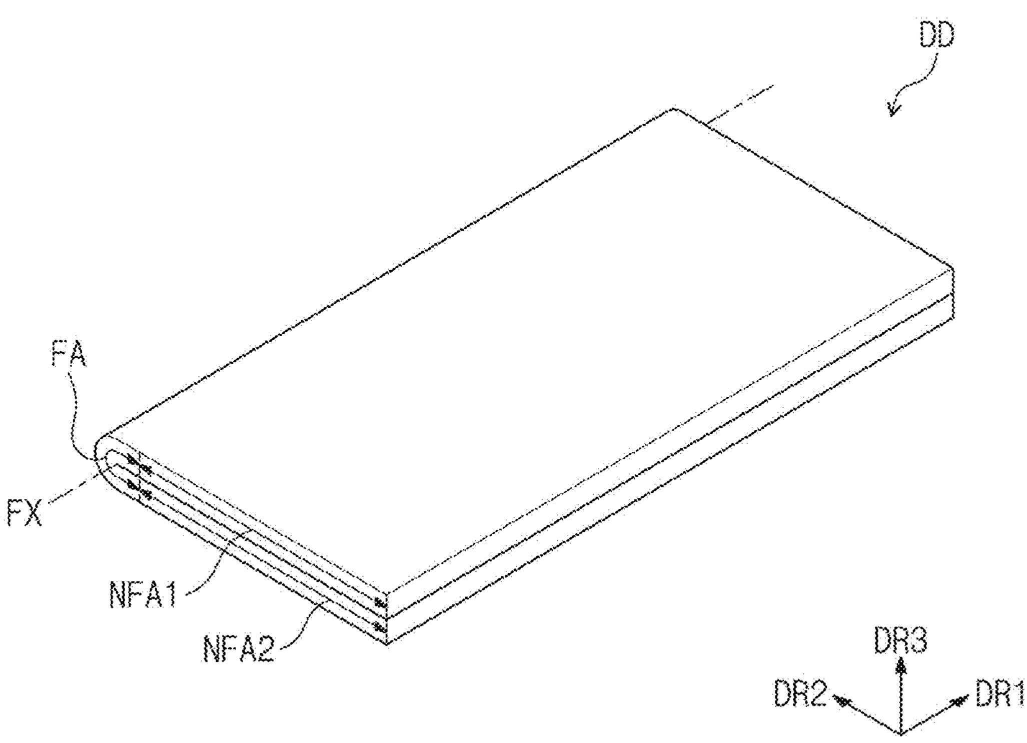
FIG. 2 is a view illustrating a folded state of the display device of FIG. 1 according to some example embodiments.

FIG. 1 is a perspective view of a display device manufactured using a support that is protected by a release film according to some example embodiments of the inventive concept. FIG. 2 is a view illustrating a folded state of the display device of FIG. 1 according to some example embodiments.

Referring to FIG. 1, a display device DD according to some example embodiments of the inventive concept has a rectangular shape having long sides extending in a first direction DR1 and short sides extending in a second direction DR2 crossing the first direction DR1. However, the embodiments according to the inventive concept are not limited thereto. For example, the display device DD may have various shapes such as a circular shape, a polygonal shape, and the like. The display device DD may be a flexible display device.

Hereinafter, a direction that substantially perpendicularly crosses (or is normal with respect to) a plane defined by the first direction DR1 and the second direction DR2 is defined as a third direction DR3. Also, in this specification, the terms "viewed from the plane" or "in a plan view" may be defined as a state when viewed in the third direction DR3.

The display device DD may include a folding area FA, where the display device DD is configured to be bent or curved without damaging the display device DD, and a plurality of non-folding areas NFA1 and NFA2 outside of the folding area FA. The non-folding areas NFA1 and NFA2 may include a first non-folding area NFA1 and a second non-folding area NFA2, although the number of non-folding areas are not necessarily limited thereto. The folding area FA may be located between the first non-folding area NFA1 and the second non-folding area NFA2. The folding area FA, the first non-folding area NFA1, and the second non-folding area NFA2 may be arranged in the second direction DR2.

For example, although one folding area FA and two non-folding areas NFA1 and NFA2 are illustrated, the embodiments according to the inventive concept are not limited thereto. For example, the number of folding area FA and the number of non-folding areas NFA1 and NFA2 are not limited thereto. For example, the display device DD may include a plurality of non-folding areas that are more than two non-folding areas and a plurality of folding areas between the non-folding areas.

A top surface of the display device DD may be defined as a display surface DS and have a plane defined by the first direction DR1 and the second direction DR2. Images IM generated from the display device DD may be provided or displayed to a user through the display surface DS.

The display surface DS may include a display area DA and a non-display area NDA around the display area DA. Images may be displayed on the display area DA, but may not be displayed on the non-display area NDA. The non-display area NDA may surround the display area DA and define an edge of the display device DD, which is printed with a color (e.g., a set or predetermined color).

The display device DD may include a plurality of sensors SN and at least one camera CAM. The sensors SN and the camera CAM may be adjacent to an edge of the display device DD. The sensors SN and the camera CAM may be located on the display area DA adjacent to the non-display area NDA. The sensors SN and the camera CAM may be located on the first and second non-folding areas NFA1 and NFA2.

For example, the sensors SN may be a proximity sensor, but the types of the sensors SN are not limited thereto. The camera CAM may photograph an external image.

Referring to FIG. 2, the display device DD may be a folding-type (foldable) display device DD that is capable of being folded or unfolded (e.g., along the folding area FA). For example, the folding area FA may be bent with respect to a folding axis FX parallel to the first direction DR1, and thus, the display device DD may be folded. The folding axis FX may be defined as a long axis that is parallel to the long side of the display device DD.

When folding the display device DD, the first non-folding area NFA1 and the second non-folding areas NFA2 may face each other, and the display device DD may be in-folded (e.g., such that the first and second non-folding areas NFA1 and NFA2 face toward each other) to prevent the display surface DS from being exposed to the outside. However, the embodiments of the inventive concept are not limited thereto. For example, the display device DD may be out-folded (e.g., such that the first and second non-folding areas NFA1 and NFA2 face away from each other) so that the display surface DS is exposed to the outside with respect to the folding axis FX.

Figure 3:
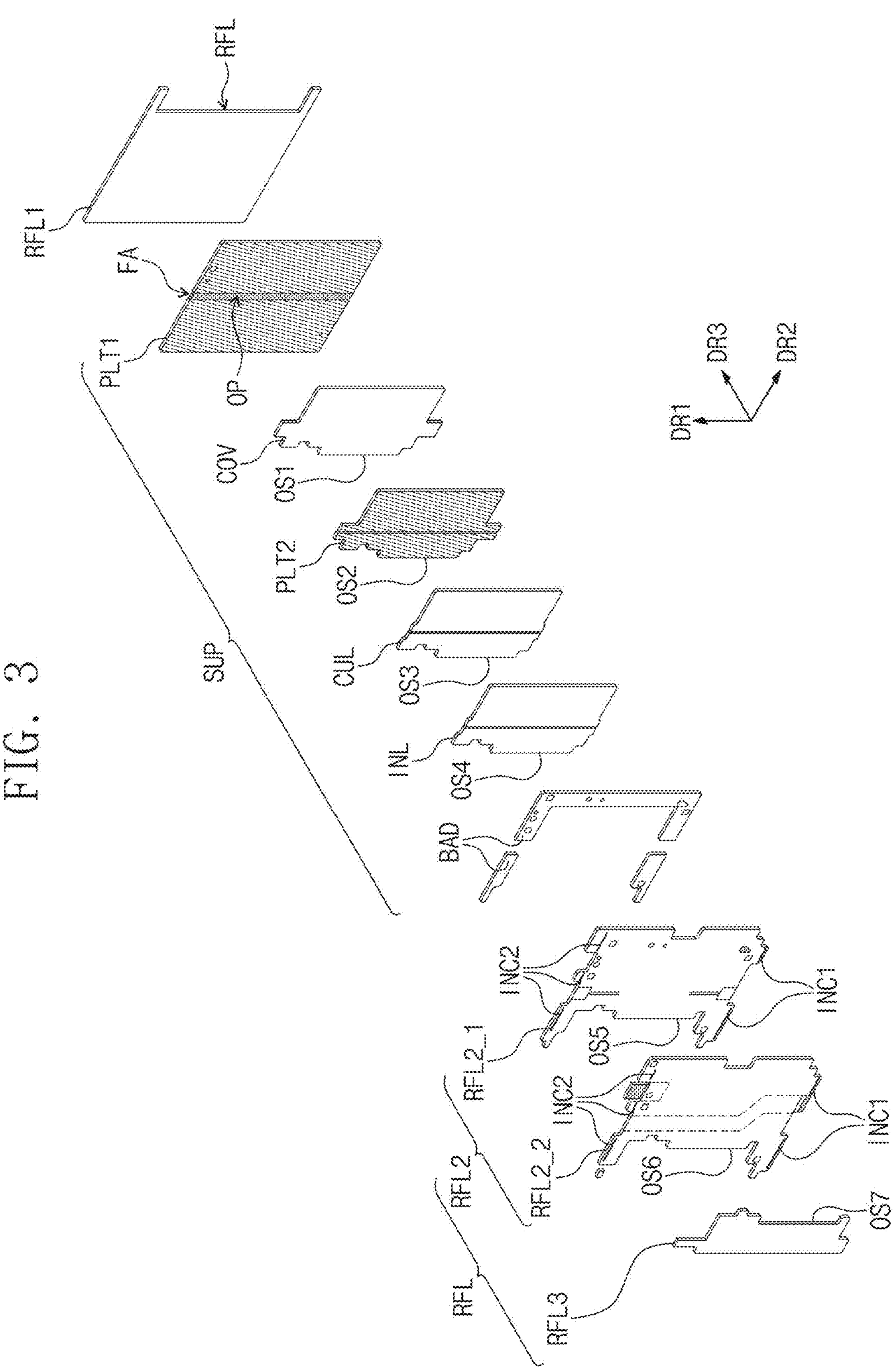
FIG. 3 is an exploded perspective view of a release film and a support protected by the release film according to some example embodiments of the inventive concept.

FIG. 3 is an exploded perspective view of a release film and a support protected by the release film according to some example embodiments of the inventive concept.

Referring to FIG. 3, a release film RFL may be arranged above and below a support SUP to protect the support SUP. The support SUP may be protected by the release film RFL and may be transferred to processes of manufacturing the display device DD.

The release film RFL includes a first release film RFL1, a second release film RFL2 located below the first release film RFL1, and a third release film RFL3 located below the first release film RFL1. The second release film RFL2 may face the first release film RFL1, and the third release film RFL3 may face the first release film RFL1.

The first release film RFL1 may be located on the support SUP. The second release film RFL2 and the third release film RFL3 may be located below the support SUP. The support SUP may be located between the first release film RFL1 and the second and third release films RFL2 and RFL3. The third release film RFL3 may be arranged adjacent to the second release film RFL2.

The first release film RFL1 may protect an upper portion of the support SUP, and the second and third release films RFL2 and RFL3 may protect a lower portion of the support SUP. According to some example embodiments, each of the first, second, and third release films RFL1, RFL2, and RFL3 may include a base film and an adhesive formed on one surface of the base film.

The second release film RFL2 may include a first sub release film RFL2_1 located below the support SUP and a second sub release film RFL2_2 located below the first sub release film RFL2_1. The first sub release film RFL2_1 is located below the first release film RFL1 to face the first release film RFL1.

A structure of the first, second, and third release films RFL1, RFL2, and RFL3 on a plane will be described in more detail below with reference to FIGS. 6 and 7.

The support SUP may include a first plate PLT1, a cover layer COV, a second plate PLT2, a cushion layer CUL, an insulating layer INL, and an edge adhesive layer BAD.

The first plate PLT1 may be located below the first release film RFL1. Openings overlapping the folding area FA may be defined in the first plate PLT1. A structure of each of the openings will be illustrated below in FIGS. 4 and 5.

The first plate PLT1 may include a material having an elastic modulus of about 60 GPa or more. The first plate PLT1 may include a metal material such as stainless steel. For example, the first plate PLT1 may include SUS 304, but embodiments according to the present disclosure are not limited thereto. For example, the first plate PLT1 may include various metal materials.

The cover layer COV may be located below the first plate PLT1. The cover layer COV may have an elastic modulus lower than that of the first plate PLT1. For example, the cover layer COV may include thermoplastic polyurethane or rubber, but embodiments according to the present disclosure are not limited thereto. The cover layer COV may be manufactured in the form of a sheet and attached to the first plate PLT1.

The second plate PLT2 may be located below the cover layer COV. The second plate PLT2 may include a metal. The second plate PLT2 may function as a heat dissipation layer. The second plate PLT2 may include copper, a copper alloy, and graphite. However, this is merely an example, and the second plate PLT2 may include various metals (for example, invar or stainless steel).

The cushion layer CUL may be located below the second plate PLT2. The cushion layer CUL may absorb an external impact. The cushion layer CUL may include a foam sheet having an elastic force (e.g., a set or predetermined elastic force). The cushion layer CUL may include foam, sponge, polyurethane, or thermoplastic polyurethane.

An insulating layer INL may be located below the cushion layer CUL. The insulating layer INL may include an insulating tape. The insulating layer INL may prevent or reduce instances of static electricity being introduced.

The edge adhesive layer BAD may be arranged along an edge of the first plate PLT1. The edge adhesive layer BAD may be located below both sides of the first plate PLT1, which are opposite to each other, in the first direction DR1.

The edge adhesive layer BAD may not be located below one side of both the sides of the first plate PLT1, which are opposite to each other, in the second direction DR2. The edge adhesive layer BAD may be located below the other side of both the sides of the first plate PLT1, which are opposite to each other, in the second direction DR2.

When viewed on the plane (or in a plan view), the second plate PLT2, the cushion layer CUL, the insulating layer INL, and the edge adhesive layer BAD may be separated from each other in an area overlapping the folding area FA.

Sides OS1, OS2, OS3, and OS4 of the second plate PLT2, the cover layer COV, the cushion layer CUL, and the insulating layer INL, which are located adjacent to one side of the first plate PLT1 may be patterned (e.g., in a set or predetermined shape).

One side OS5 of the first sub release film RFL2_1 and one side OS6 of the second sub release film RFL2_2 may have shapes corresponding to the sides OS1, OS2, OS3, and OS4 of the second plate PLT2, the cover layer COV, the cushion layer CUL, and the insulating layer INL.

One side OS7 of the third release film RFL3 facing sides OS5 and OS6 of the first and second sub release films RFL2_1 and RFL2_2 may have a shape opposite to that of each of sides OS5 and OS6 of the first and second sub release films RFL2_1 and RFL2_2. For example, when each of the sides OS5 and OS6 of the first and second sub release films RFL2_1 and RFL2_2 is defined as an intaglio, one side OS7 of the third release film RFL3 may be defined as a relief corresponding to the intaglio.

A plurality of cutoff parts INC1 and INS2 may be defined in the second release film RFL2. The cutoff parts INC1 and INS2 may be defined in the first and second sub release films RFL2_1 and RFL2_2. A detailed configuration of each of the cutoff parts INC1 and INS2 will be described in more detail below with reference to FIGS. 6 and 7.

For example, the configurations illustrated in FIG. 3 are illustrated as having similar thicknesses, but may have substantially different thicknesses. A structure with respect to the above-described thicknesses will be illustrated below in FIG. 8.

Figure 4:
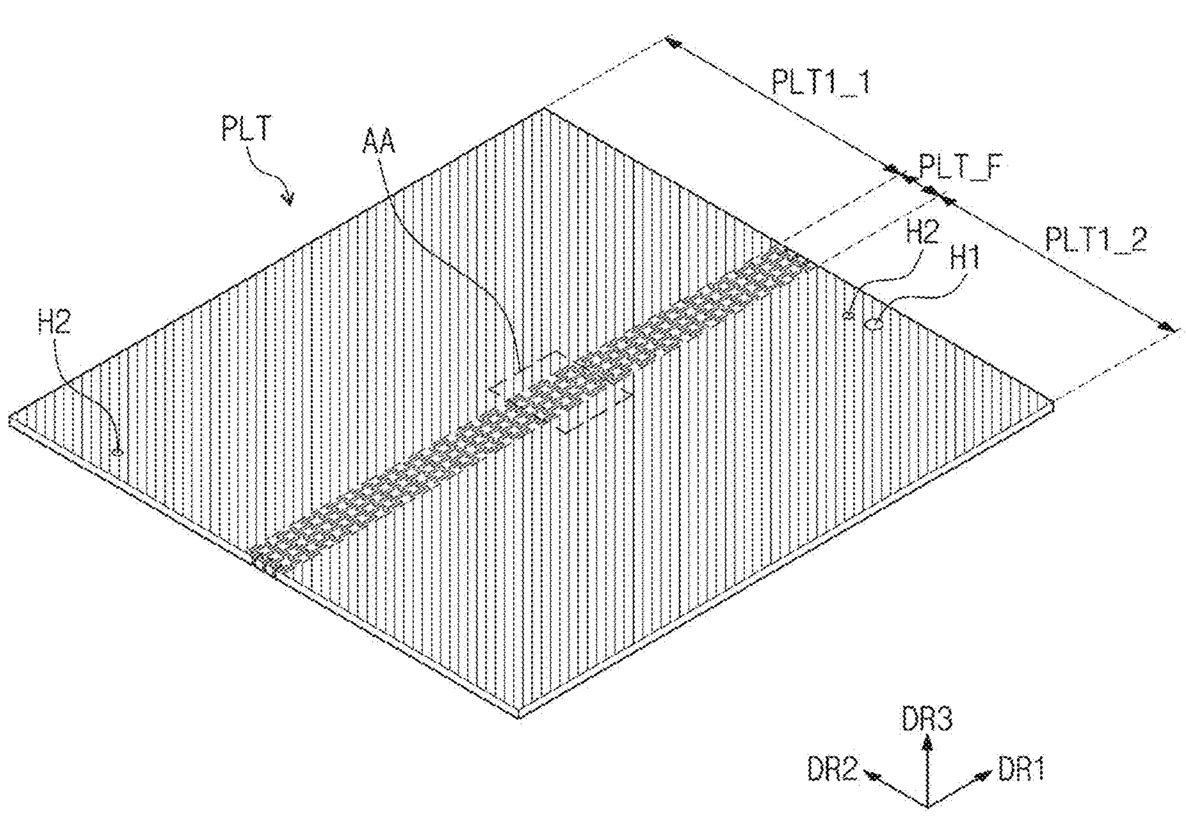
FIG. 4 is an enlarged perspective view of a first plate of FIG. 3 according to some example embodiments.
Figure 5:
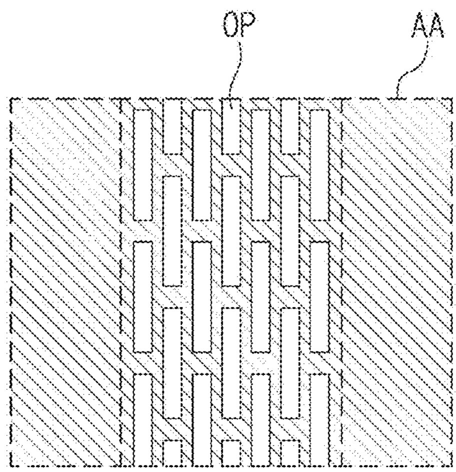
FIG. 5 is an enlarged view of an area AA of FIG. 4 according to some example embodiments.

FIG. 4 is an enlarged perspective view of a first plate of FIG. 3. FIG. 5 is an enlarged view of an area AA of FIG. 4.

Referring to FIGS. 4 and 5, a first plate PLT may include a first_1 plate PLT1_1, a first_2 plate PLT1_2, and a folding plate PLT_F. The folding plate PLT_F may be located between the first_1 plate PLT1_1 and the first_2 plate PLT1_2.

A plurality of openings OP may be defined in the folding plate PLT_F. The openings OP may be arranged (e.g., in a set or predetermined arrangement). The openings OP may be arranged in a lattice shape.

Because the openings OP are defined in the folding plate PLT_F, an area of the folding plate PLT_F may be reduced to reduce rigidity of the folding plate PLT_F. Thus, flexibility of the folding plate PLT_F may be higher when compared to a case in which the openings OP are not defined in the folding plate PLT_F. As a result, the folding plate PLT_F may be relatively easily folded.

A first hole H1 and a plurality of second holes H2 may be defined in the first plate PLT1. The first hole H1 and the second holes H2 may be adjacent to an edge of the first plate PLT1. For example, the first hole H1 and one second hole H2 may be defined in the first_2 plate PLT1_2, and the other second hole H2 may be defined in the first_1 plate PLT1_1. However, the positions of the first and second holes H1 and H2 are not limited thereto.

The camera CAM may be located in the first hole H1 as a functional element. The above-described sensors SN may be located in the second holes H2.

Figure 6A:
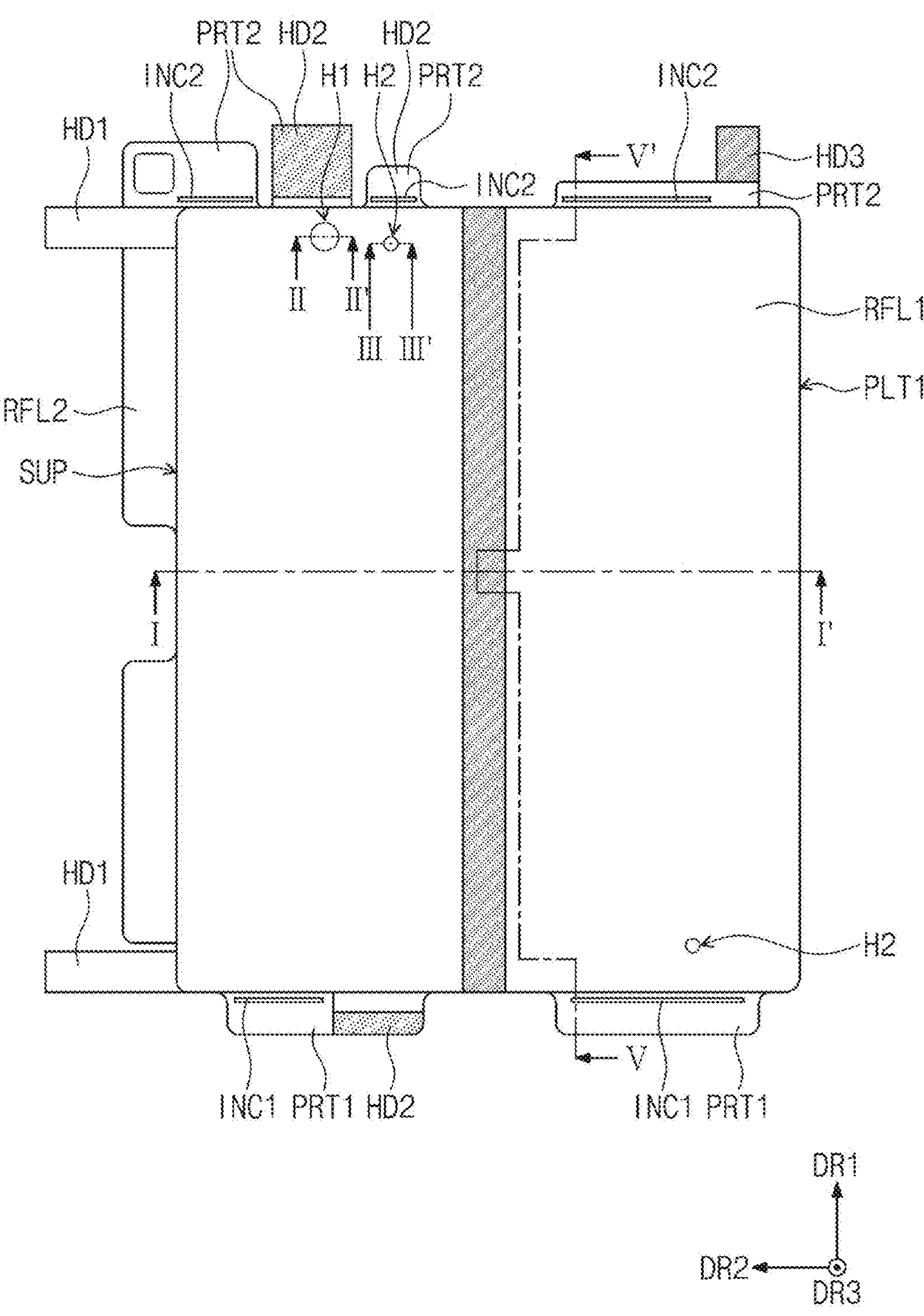
FIG. 6A is a plan view of the support of FIG. 3 and a first release film on the support according to some example embodiments.
Figure 6B:
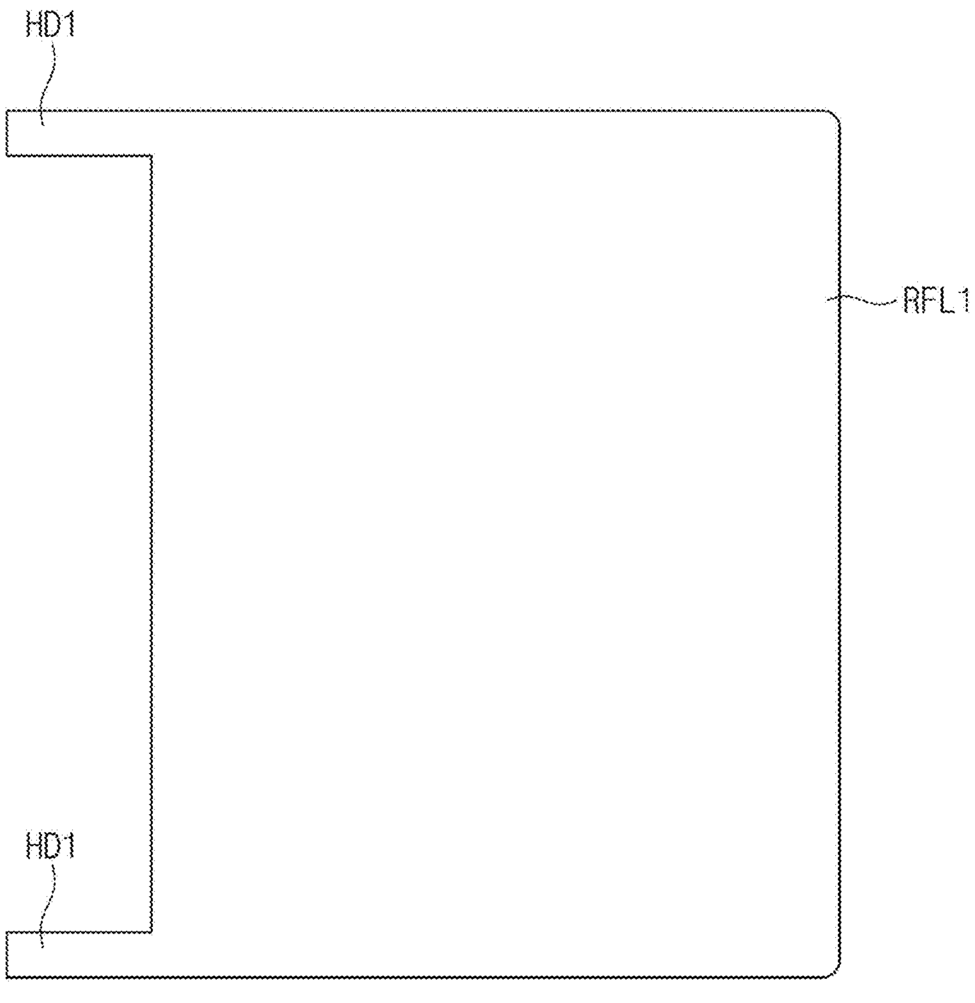
FIG. 6B is a view illustrating only the first release film of FIG. 6A according to some example embodiments.
Figure 7A:
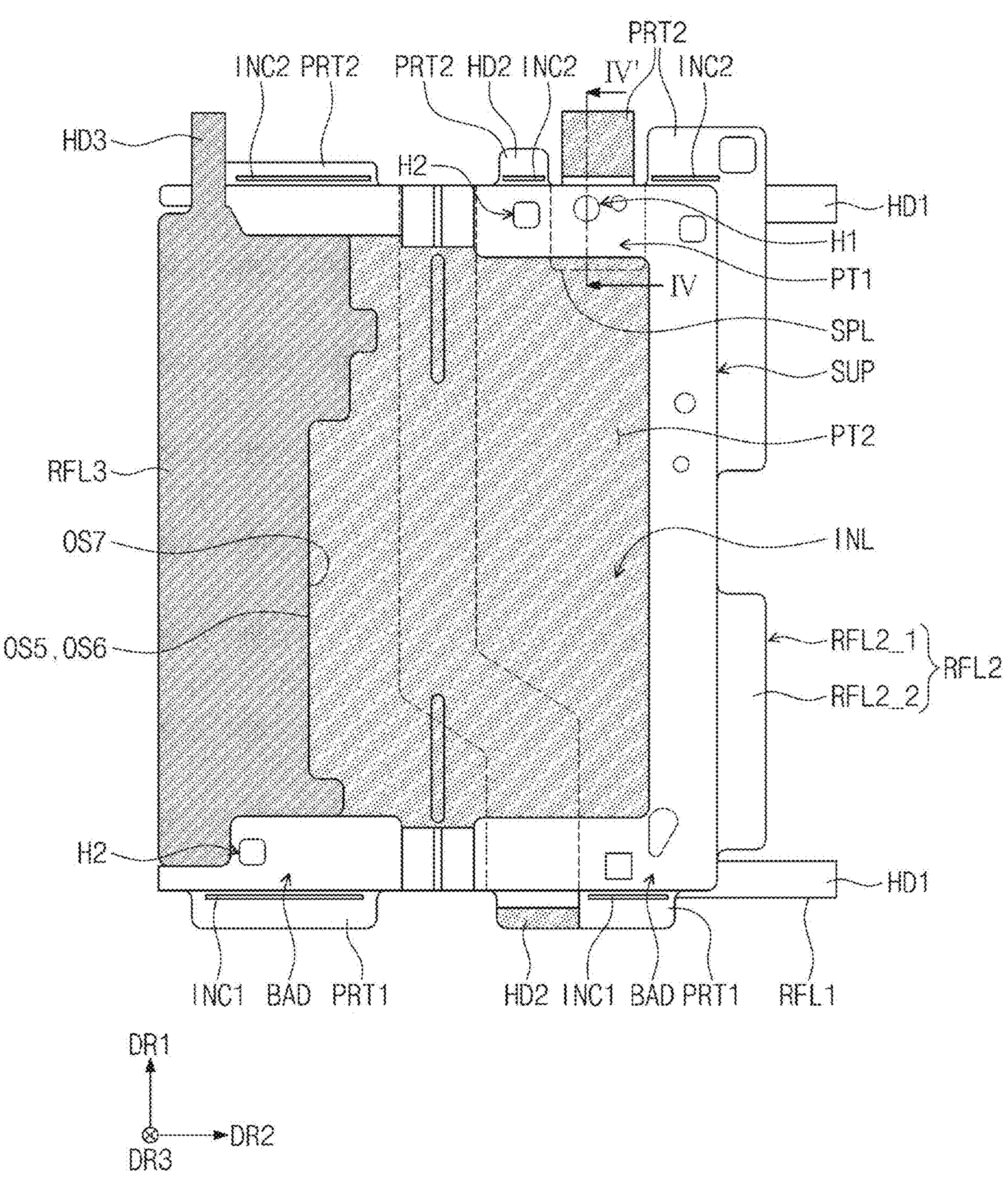
FIG. 7A is a plan view of the support of FIG. 3 and a second release film below the support according to some example embodiments.
Figure 7B:
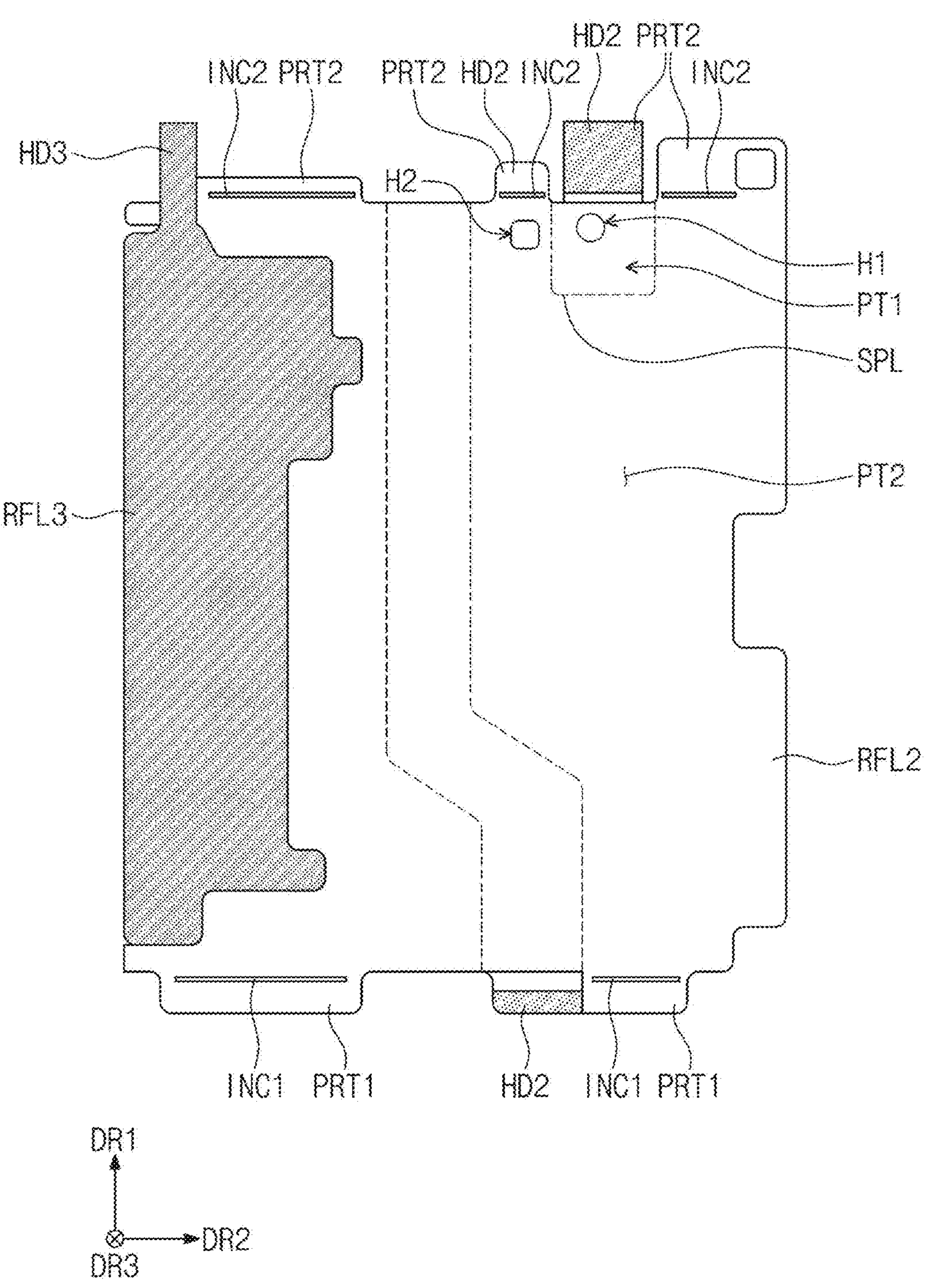
FIG. 7B is a view illustrating only second and third release films in FIG. 7A according to some example embodiments.

FIG. 6A is a plan view of the support of FIG. 3 and a first release film located on the support. FIG. 6B is a view illustrating only the first release film of FIG. 6A. FIG. 7A is a plan view of the support of FIG. 3 and a second release film located below the support. FIG. 7B is a view illustrating only second and third release films in FIG. 7A.

For example, openings defined in the first plate PLT1 in FIG. 6A are illustrated in gray color, and a shape of the first plate PLT1 below the first release film RFL1 is illustrated together with the first release film RFL1. Also, in FIG. 7A, the shapes of the insulating layer INL and the edge adhesive layer BAD below the second and third release films RFL2 and RFL3 are illustrated together with the second and third release films RFL2 and RFL3.

Referring to FIGS. 6A and 6B, the first release film RFL1 may cover an upper portion of the support SUP. The first release film RFL1 may cover the first plate PLT1. When viewed on the plane (or in a plan view), the first release film RFL1 may include a plurality of first handles HD1 protruding outward from the support SUP.

According to some example embodiments, the first release film RFL1 may be removed using the first handles HD1. For example, in a delamination structure, the first handles HD1 are griped to delaminate the first release film RFL1.

Referring to FIGS. 7A and 7B, the second and third release films RFL2 and RFL3 may cover the lower portion of the support SUP. The second and third release films RFL2 and RFL3 may cover the insulating layer INL and the edge adhesive layer BAD.

The third release film RFL3 may be adjacent to the second release film RFL2 in the second direction DR2. One side OS7 of the third release film RFL3 may be adjacent to the sides OS5 and OS6 of the second release film RFL2.

The second sub release film RFL2_2 may include a first portion PT1 overlapping the first hole H1 and a second portion PT2 around the first portion PT1. A separation line SPL may be defined between the first portion PT1 and the second portion PT2. The first portion PT1 may be separated from the separation line SPL. The first portion PT1 may be separated from the second portion PT2 and attached to and detached from the first sub release film RFL2_1. Hereinafter, the above-described constitutions will be described in more detail.

When viewed on the plane (or in a plan view), the sum of areas of the second and third release films RFL2 and RFL3 may be greater than that of the support SUP. When viewed on the plane (or in a plan view), the second release film RFL2 may include a plurality of protrusions PRT1 and PRT2 protruding outward from the support SUP.

A portion of the protrusions PRT1 and PRT2 may be defined as a second handle HD2. According to some example embodiments, the second release film RFL2 may be removed using the second handles HD2. The first portion PT1 may be removed using the second handle HD2 adjacent to the first hole H1.

The protrusions PRT1 and PRT2 may include a plurality of first protrusions PRT1 protruding from one side of both sides of the support SUP, which are opposite to each other in the first direction DR1, and a plurality of second protrusions PRT2 protruding outside from the other side of both the sides of the support SUP.

The first cutoff parts INC1 may be defined in the first protrusions PRT1, respectively. The first cutoff parts INC1 may extend in the second direction DR2. The first cutoff parts INC1 may be defined between both sides of the first protrusions PRT1, which are opposite to each other in the second direction DR2.

The second cutoff parts INC2 may be defined in the second protrusions PRT2, respectively. The second cutoff parts INC2 may extend in the second direction DR2. The second cutoff parts INC2 may be defined between both sides of the second protrusions PRT2, which are opposite to each other in the second direction DR2.

The third release film RFL3 may include a third handle HD3 protruding outside the support SUP. According to some example embodiments, the third release film RFL3 may be removed using the third handle HD3.

Although the first and second cutoff parts INC1 and INC2 are defined in the first and second protrusions PRT1 and PRT2, the embodiments of the inventive concept are not limited thereto. For example, the first cutoff parts INC1 may be defined in the first protrusions PRT1, and the second cutoff parts INC2 may not be defined in the second protrusions PRT2. Also, the first cutoff parts INC1 may not be defined in the first protrusions PRT1, and the second cutoff parts INC2 may be defined in the second protrusions PRT2.

Figure 6B:
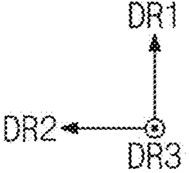
Figure 8:
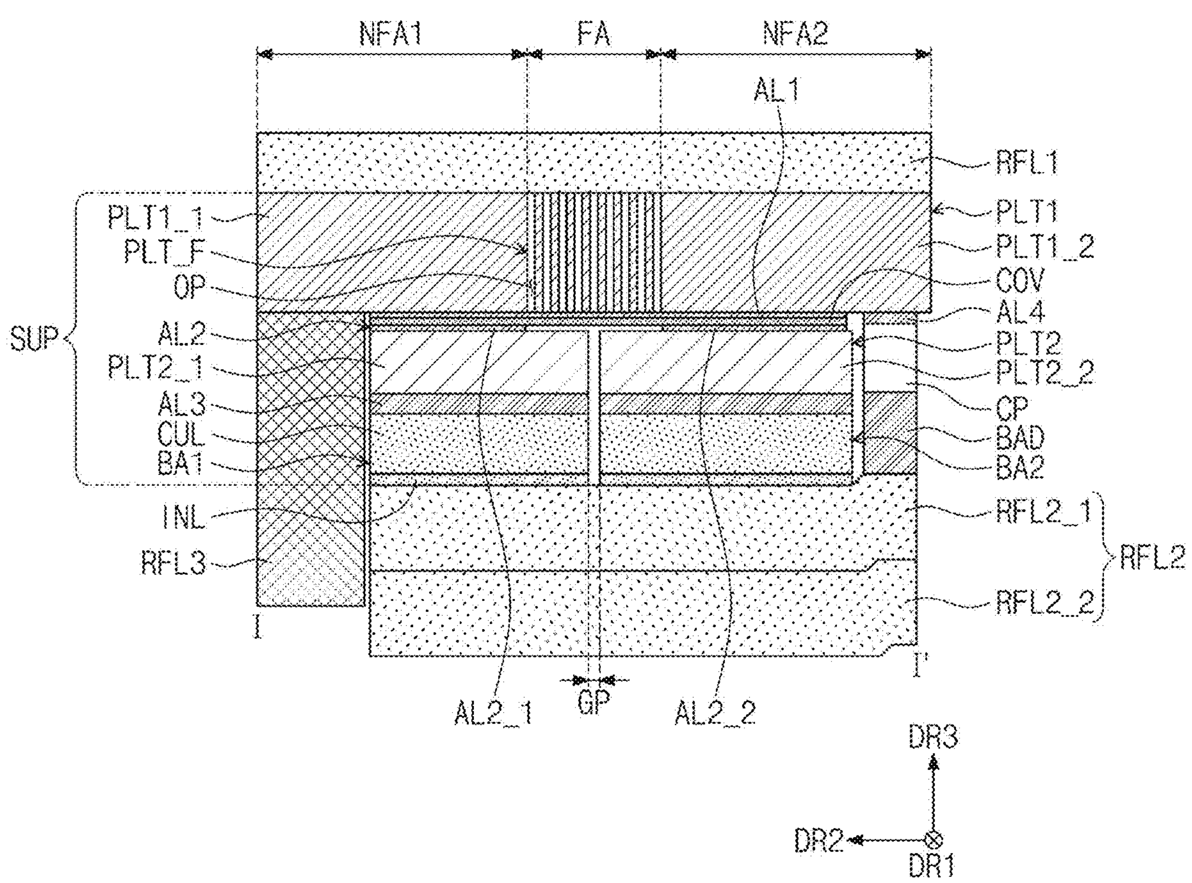
FIG. 8 is a cross-sectional view taken along the line I-I' of FIG. 6 according to some example embodiments.

FIG. 8 is a cross-sectional view taken along the line I-I' of FIG. 6.

Referring to FIG. 8, the first release film RFL1 may be located on the first plate PLT1 to protect the first plate PLT1.

When viewed on the plane (or in a plan view), the first_1 plate PLT1_1 may overlap the first non-folding area NFA1. When viewed on the plane (or in a plan view), the first_2 plate PLT1_2 may overlap the second non-folding area NFA2. When viewed on the plane (or in a plan view), the folding plate PLT_F may overlap the folding area FA.

The cover layer COV located below the first plate PLT1 may cover the openings OP defined in the first plate PLT1. The first adhesive layer AL1 may be located between the cover layer COV and the first plate PLT1, and the cover layer COV and the first plate PLT1 may be bonded to each other by the first adhesive layer AL1. The cover layer COV may prevent or reduce instances of foreign substances being introduced into the openings OP defined in the first plate PLT1.

The second plate PLT2 may be located below the cover layer COV, and a second adhesive layer AL2 may be located between the cover layer COV and the second plate PLT2. The cover layer COV and the second plate PLT2 may be bonded to each other by the second adhesive layer AL2.

When viewed on the plane (or in a plan view), the second adhesive layer AL2 may not overlap the folding area FA.

The second adhesive layer AL2 may include a first portion AL2_1 and a second portion AL2_2, which are spaced apart from each other. When viewed on the plane (or in a plan view), the first portion AL2_1 may overlap the first non-folding area NFA1, and the second portion AL2_2 may overlap the second non-folding area NFA2. The first portion AL2_1 and the second portion AL2_2 may not overlap the folding area FA. The second adhesive layer AL2 may not be arranged at an area corresponding to the folding area FA to improve flexibility of the cover layer COV.

When viewed on the plane (or in a plan view), the second plate PLT2 may include a second_1 plate PLT2_1 overlapping the first non-folding area NFA1 and a second_2 plate PLT2_2 overlapping the second non-folding area NFA2.

A gap GP between the second_1 plate PLT2_1 and the second_2 plate PLT2_2 may be less than that between the first portion AL2_1 and the second portion AL2_2 in the second direction DR2. That is, the gap GP may be less than a length of the folding area FA.

When viewed on the plane (or in a plan view), the gap GP between the second_1 plate PLT2_1 and the second_2 plate PLT2_2 may overlap the folding area FA. For example, the gap GP between the second_1 plate PLT2_1 and the second_2 plate PLT2_2 may be about 0.3 mm to about 3 mm.

The cushion layer CUL may be located below the second plate PLT2, and a third adhesive layer AL3 may be located between the second plate PLT2 and the cushion layer CUL. The second plate PLT2 and the cushion layer CUL may be bonded to each other by the third adhesive layer AL3.

The insulating layer INL provided as an insulating tape may be attached below the cushion layer CUL. Each of the cushion layer CUL, the third adhesive layer AL3, and the insulating layer INL may include two portions separated from each other with the gap GP therebetween.

The third release film RFL3 may be located below the first plate PLT1. The third release film RFL3 may be adjacent to one side of the first plate PLT1. The third release film RFL3 may be adjacent to first edges BA1 of the cover layer COV, the second plate PLT2, the cushion layer CUL, and the insulating layer INL. The first edges BA1 of the cover layer COV, the second plate PLT2, the cushion layer CUL, and the insulating layer INL may correspond to the sides OS1, OS2, OS3, and OS4 of FIG. 3.

A step compensation layer CP may be located below the first plate PLT1, and a fourth adhesive layer AL4 may be located between the step compensation layer CP and the first plate PLT1. The step compensation layer CP and the first plate PLT1 may be bonded to each other by the fourth adhesive layer AL4.

The edge adhesive layer BAD may be located below the step compensation layer CP. Each of the first, second, third, and fourth adhesive layers AL1, AL2, AL3, and AL4 and the edge adhesive layer BAD may include a pressure sensitive adhesive (PSA) or optically clear adhesive (OCA), but the type of the adhesive is not limited thereto.

The fourth adhesive layer AL4, the step compensation layer CP, and the edge adhesive layer BAD may be adjacent to the other side of the first plate PLT1. The step compensation layer CP and the edge adhesive layer BAD may be adjacent to the second edges BA2 of the cover layer COV, the second plate PLT2, the cushion layer CUL, and of the insulating layer INL.

The cover layer COV, the second plate PLT2, the cushion layer CUL, and the insulating layer INL may be located between the third release film RFL3 and the step compensation layer CP and between the third release film RFL3 and the edge adhesive layer BAD.

The second release film RFL2 may be located below the insulating layer INL and below the edge adhesive layer BAD. The first sub release film RFL2_1 may be located below the insulating layer INL and below the edge adhesive layer BAD. The second sub release film RFL2_2 may be located below the first sub release film RFL2_1.

According to some example embodiments, a silicone adhesive may be located between the first sub release film RFL2_1 and the second sub release film RFL2_2. In this case, the second sub release film RFL2_2 may be easily detached from the first sub release film RFL2_1.

The third release film RFL3 may be adjacent to the second release film RFL2. When viewed on the plane (or in a plan view), the third release film RFL3 may not overlap the second release film RFL2.

A thickness of the first plate PLT1 may be greater than that of each of the second plate PLT2 and the cushion layer CUL. A thickness of each of the cover layer COV and the insulating layer INL may be less than that of each of the second plate PLT2 and the cushion layer CUL. The thickness may be defined as a value measured in the third direction DR3.

A thickness of the first release film RFL1 may be less than that of the first plate PLT1. A thickness of the second release film RFL2 may be greater than that of the first plate PLT1. For example, the thickness of the first release film RFL1 may be about 82 micrometers (μm). The thickness of the second release film RFL2 may be about 508 micrometers (μm). A thickness of the third release film RFL3 may be greater than that of the first plate PLT1.

Figure 9:
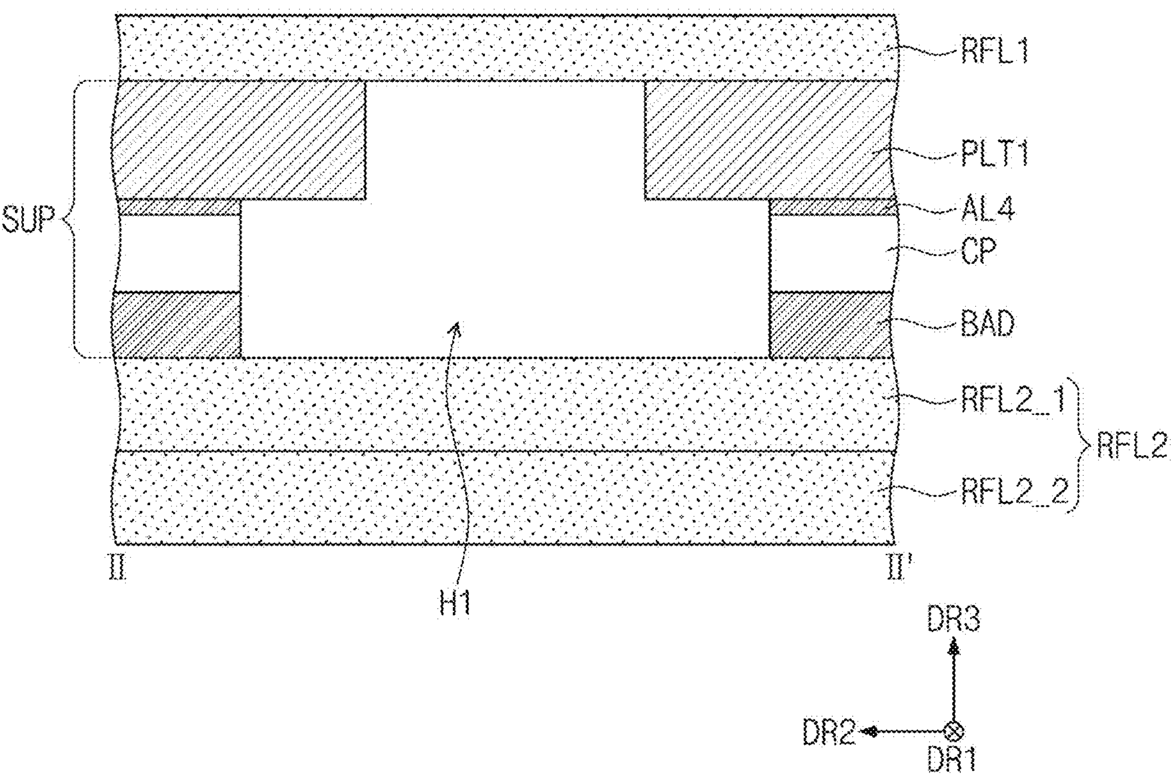
FIG. 9 is a cross-sectional view taken along the line II-II' of FIG. 6 according to some example embodiments.

FIG. 9 is a cross-sectional view taken along the line II-II' of FIG. 6.

Referring to FIG. 9, the first hole H1 is defined in the support SUP, and the first release film RFL1 may be arranged above the support SUB to cover the first hole H1. The second release film RFL2 may be arranged below the support SUP to cover the first hole H1.

The first hole H1 may be defined in the edge adhesive layer BAD, the step compensation layer CP, the fourth adhesive layer AL4, and the first plate PLT1. A width of the first hole H1 defined in the edge adhesive layer BAD, the step compensation layer CP, and the fourth adhesive layer AL4 may be greater than that of the first hole H1 defined in the first plate PLT1 in the first and second directions DR1 and DR2.

Figure 10:
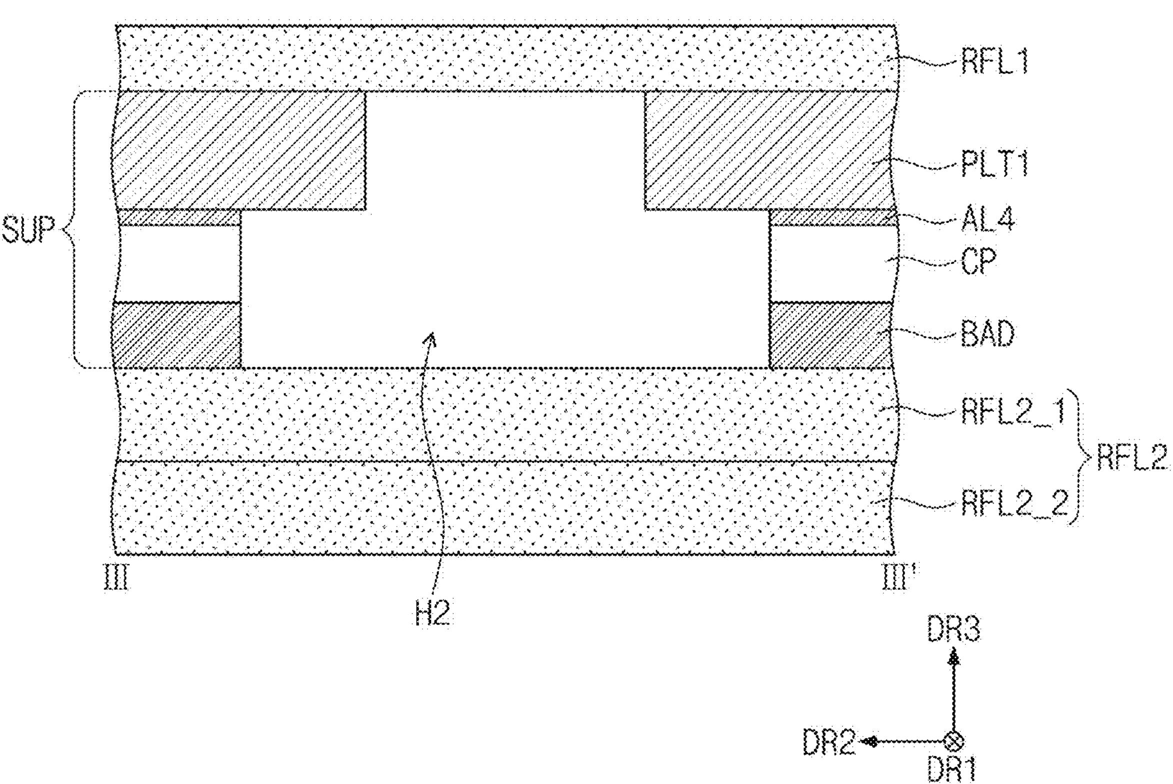
FIG. 10 is a cross-sectional view taken along the line III-III' of FIG. 6 according to some example embodiments.

FIG. 10 is a cross-sectional view taken along the line III-III' of FIG. 6.

Referring to FIG. 10, a second hole H2 is defined in the support SUP, and the first release film RFL1 may be located above the support SUP to cover the second hole H2. The second release film RFL2 may be located below the support SUP to cover the second hole H2.

The second hole H2 may be defined in the edge adhesive layer BAD, the step compensation layer CP, the fourth adhesive layer AL4, and the first plate PLT1. A width of the second hole H2 defined in the edge adhesive layer BAD, the step compensation layer CP, and the fourth adhesive layer AL4 may be greater than that of the second hole H2 defined in the first plate PLT1 in the first and second directions DR1 and DR2.

Figure 11:
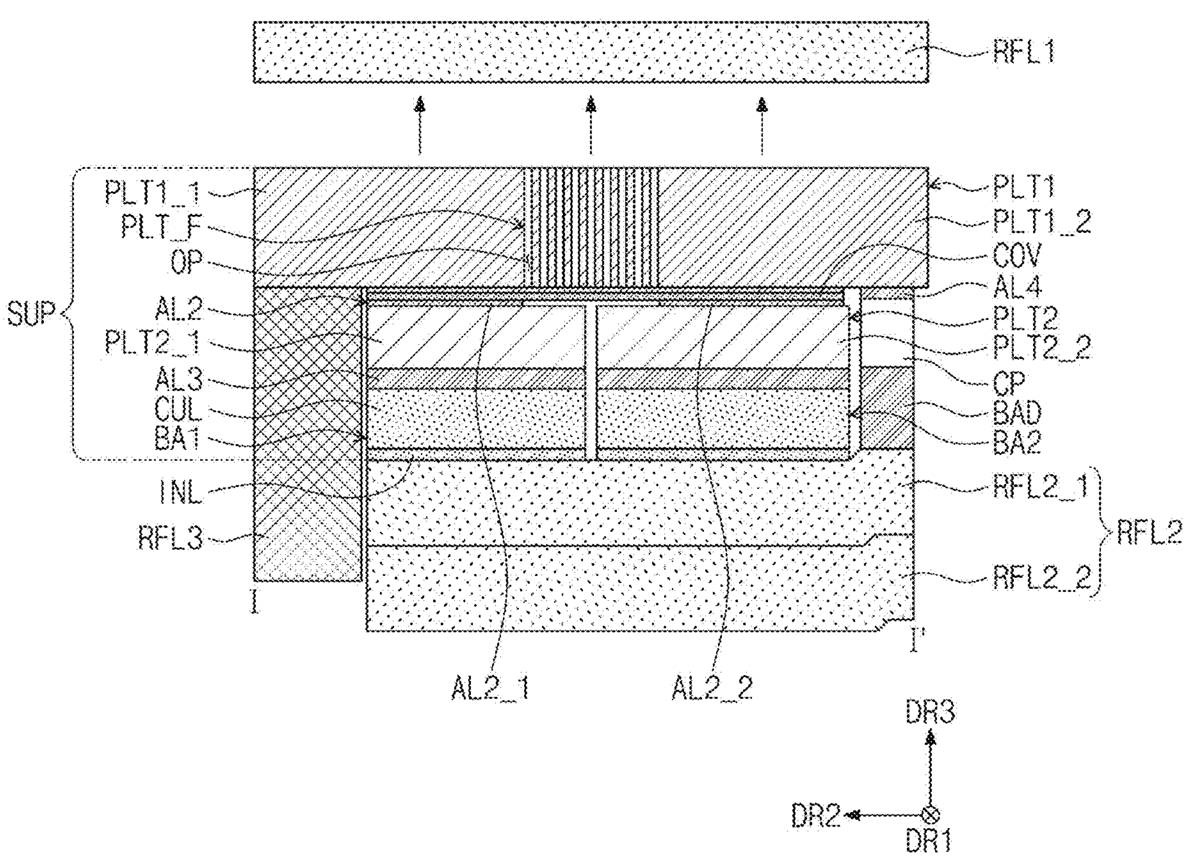
FIGS. 11 and 12 are view for explaining a process of attaching a display module to a support of FIG. 8 according to some example embodiments.
Figure 12:
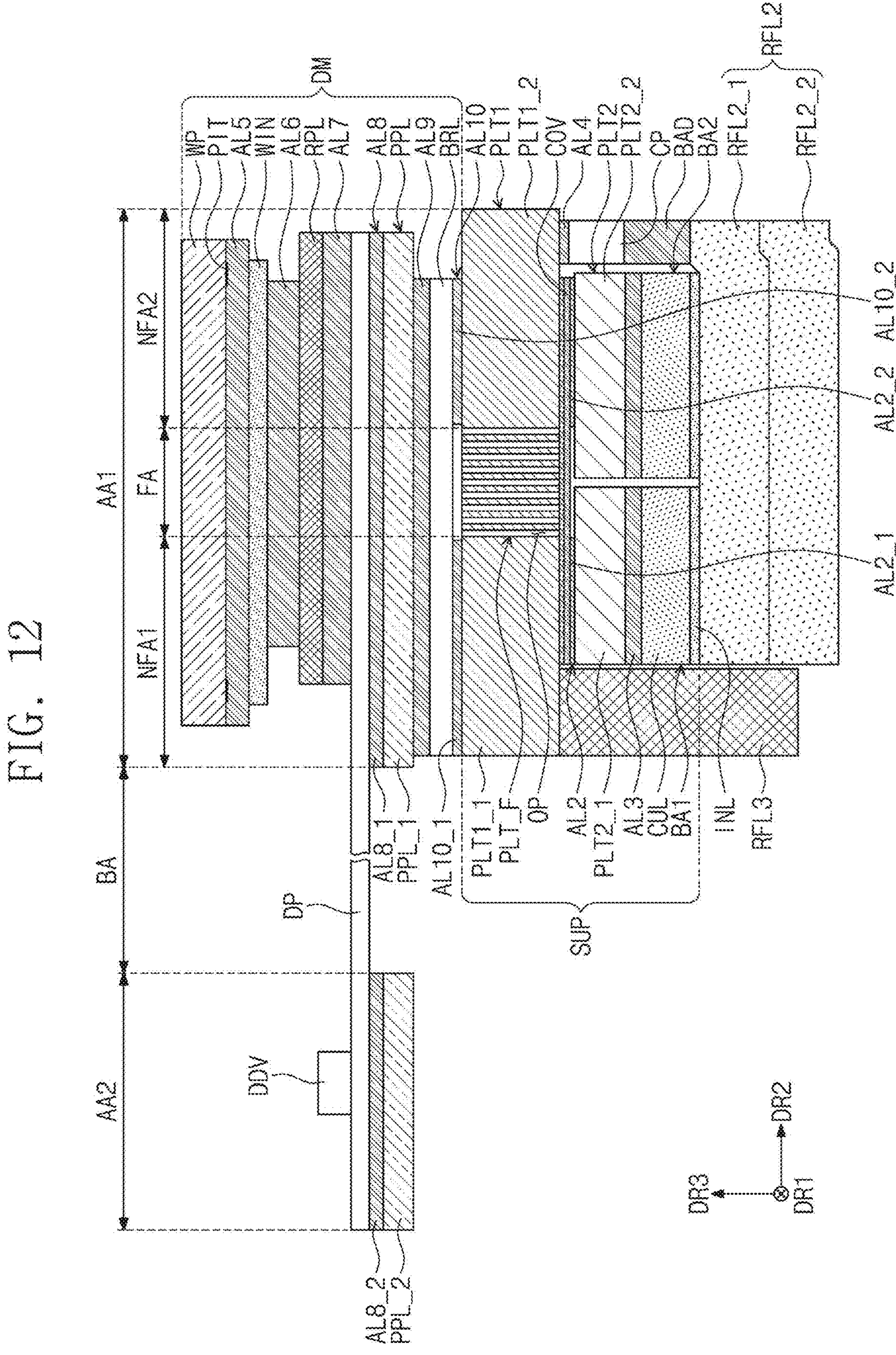

FIGS. 11 and 12 are view for explaining a process of attaching the display module to the support of FIG. 8.

Referring to FIG. 11, the first release film RFL1 located on the support SUP may be removed.

Referring to FIG. 12, the display module DM may be attached on the support SUP. The display module DM may be attached to a top surface of the first plate PLT1. The first plate PLT1 may support the display module DM. The heat dissipation performance of the display module DM may be improved by the first plate PLT1 and the second plate PLT2.

The second plate PLT2_1 may support the first non-folding area NFA1. The second plate PLT2_2 may support the second non-folding area NFA2. The second plate PLT2_1 and the second plate PLT2_2 may extend to the folding area FA and be located adjacent to each other in the folding area FA.

The second plate PLT2_1 and the second plate PLT2_2 may support the folding plate PLT_F in which openings OP are defined in the folding area FA. When a pressure is applied to the folding plate PLT_F from the top, deformation of a portion of the folding plate PLT_F may be prevented by the second plate PLT2_1 and the second plate PLT2_2.

The display module DM includes a display panel DP, an anti-reflection layer RLP, a window WIN, a window protection layer WP, a panel protection layer PPL, a barrier layer BRL, and fifth to tenth adhesive layers AL5 to AL10. The anti-reflection layer RPL, the window WIN, and the window protection layer WP may be located on the display panel DP. The panel protection layer PPL may be located below the display panel DP.

The display panel DP may include a plurality of pixels for displaying an image. The display panel DP may be a flexible display panel. For example, the display panel DP may include a plurality of electronic elements located on a flexible substrate.

According to some example embodiments of the inventive concept, the display panel 110 may be an organic light emitting display panel. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, and the like. Hereinafter, the display panel DP is described as an organic light emitting display panel.

The display panel DP may include a first area AA1, a second area AA2, and a bending area BA between the first area AA1 and the second area AA2. A data driver DDV may be arranged at the second area AA2.

The anti-reflection layer RPL may be located on the display panel DP. The anti-reflection layer RPL may be defined as an external light anti-reflection film. The anti-reflection layer RPL may reduce reflectance of external light incident to the display panel DP from the outside.

When the external light traveling toward the display panel DP is reflected from the display panel DP and provided again to an external user, the user may visually recognize the external light, like a mirror. To prevent this phenomenon from occurring, for example, the anti-reflection layer RPL may include a plurality of color filters that display the same color as that of the pixels.

The color filters may filter external light to display the same color as that of the pixels. In this case, the external light may not be visually recognized by the user. However, the embodiments of the inventive concept are not limited thereto, and the anti-reflection layer RPL may include a phase retarder and/or a polarizer to reduce reflectance of the external light.

The window WIN may be arranged on the anti-reflection layer RPL. The window WIN may protect the display panel DP and the anti-reflection layer RPL from external scratches. The window WIN may have optically transparent properties.

The window WIN may include glass. The window WIN may be defined as ultra-thin glass UTG. However, the embodiments of the inventive concept are not limited thereto, and the window WIN may include a synthetic resin film.

The window WIN may have a single layered structure or a multilayered structure. For example, the window WIN may include a plurality of plastic films bonded to each other by using an adhesive or include a glass substrate and a plastic film, which are bonded to each other by using an adhesive.

The window protection layer WP may be arranged on the window WIN. The window protection layer WP may include a flexible plastic material such as polyimide or polyethylene terephthalate. According to some example embodiments, at least one of a hard coating layer, an anti-fingerprint layer, or an anti-reflection layer may be arranged on a top surface of the window protection layer WP.

A printed layer PIT may be located on a bottom surface of the window protection layer WP. The printed layer PIT may have a black color, but the color of the printed layer PIT is not limited thereto. The printed layer PIT may be adjacent to an edge of the window protection layer WP.

The fifth adhesive layer AL5 may be located between the window protection layer WP and the window WIN. The window protection layer WP and the window WIN may be bonded to each other by the fifth adhesive layer AL5. The fifth adhesive layer AL5 may cover the printed layer PIT.

The sixth adhesive layer AL6 may be located between the window WIN and the anti-reflection layer RPL. The window WIN and the anti-reflection layer RPL may be bonded to each other by the sixth adhesive layer AL6.

The seventh adhesive layer AL7 may be located between the anti-reflection layer RPL and the display panel DP. The anti-reflection layer RPL and the display panel DP may be bonded to each other by the seventh adhesive layer AL7.

The panel protection layer PPL may be located below the display panel DP. The panel protection layer PPL may protect the lower portion of the display panel DP. The panel protection layer PPL may include a flexible plastic material. For example, the panel protection layer PPL may include polyethylene terephthalate (PET).

The panel protection layer PPL may include a first portion PPL_1 located below the first area AA1 and a second portion PPL_2 located below the second area AA2. The panel protection layer PPL may not be located below the bending area BA.

The barrier layer BRL may be located below the panel protection layer PPL. Resistance to compression force due to external pressing may increase by the barrier layer BRL. Accordingly, the barrier layer BRL may serve to prevent deformation of the display panel DP from occurring. The barrier layer BRL may include a flexible plastic material such as polyimide or polyethylene terephthalate.

The barrier layer BRL may have a color that absorbs light. The barrier layer BRL may have a black color. In this case, when viewing the display module DM from an upper side of the display module DM, components located below the barrier layer BRL may not be visually recognized.

The eighth adhesive layer AL8 may be located between the display panel DP and the panel protection layer PPL. The display panel DP and the panel protection layer PPL may be bonded to each other by the eighth adhesive layer AL8. The eighth adhesive layer AL8 may include a first portion AL8_1 arranged below the first area AA1 and a second portion AL8_2 arranged below the second area AA2. The eighth adhesive layer AL8 may not be located below the bending area BA.

The ninth adhesive layer AL9 may be located between the first portion PPL_1 of the panel protection layer PPL and the barrier layer BRL. The first portion PPL_1 of the panel protection layer PPL and the barrier layer BRL may be bonded to each other by the ninth adhesive layer AL9.

The tenth adhesive layer AL10 may be located between the barrier layer BRL and the first plate PLT1. The barrier layer BRL and the first plate PLT1 may be attached to each other by the tenth adhesive layer AL10.

The tenth adhesive layer AL10 includes a first portion AL10_1 overlapping the first non-folding area NFA1 and a second portion AL10_2 overlapping the second non-folding area NFA2 when viewed on the plane (or in a plan view). The tenth adhesive layer AL10 may not overlap the folding area FA. Because the tenth adhesive layer AL10 is not located at the portion overlapping the folding area FA, flexibility of the first plate PLT1 may be improved.

Each of the fifth to tenth adhesive layers AL5 to AL10 may include a transparent adhesive such as a pressure-sensitive adhesive (PSA) or an optically clear adhesive (OCA).

According to some example embodiments, the second and third release films RFL2 and RFL3 may be removed later, and the edge adhesive layer BAD may be attached to a set structure accommodating the display module DM and the support SUP.

Figure 13:
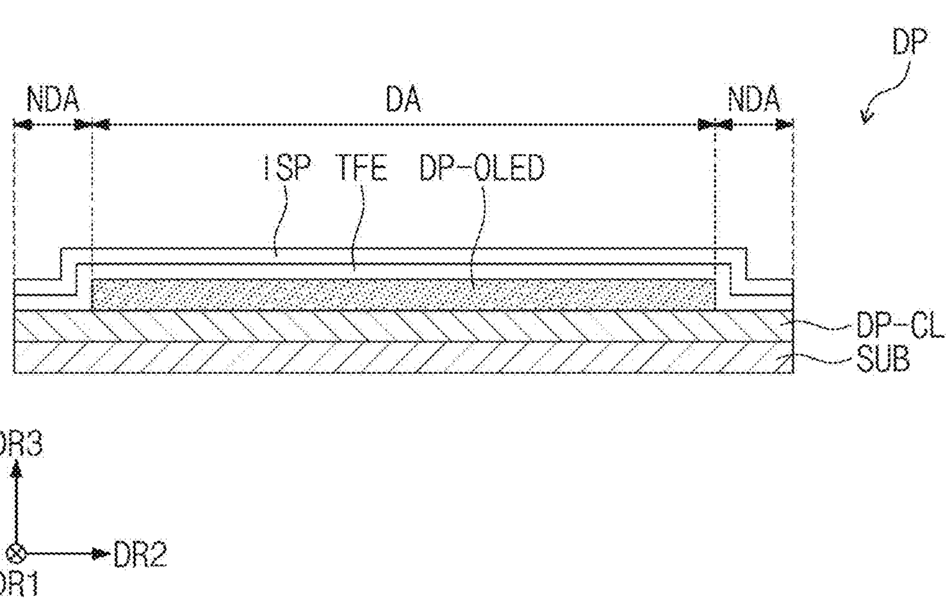
FIG. 13 is a cross-sectional view a display panel of FIG. 12 according to some example embodiments.

FIG. 13 is a cross-sectional view of the display panel of FIG. 12 according to some example embodiments.

Referring to FIG. 13, the display panel DP may include a substrate SUB, a circuit element layer DP-CL located on the substrate SUB, and a display element layer DP-OLED located on the circuit element layer DP-CL, a thin film encapsulation layer TFE located on the display element layer DP-OLED, and an input sensing part ISP located on the thin film encapsulation layer TFE. The display element layer DP-OLED may be located at the display area DA.

The substrate SUB may include a display area DA and a non-display area NDA around the display area DA. The substrate SUB may include a flexible plastic material. For example, the substrate SUB may include polyimide (PI).

The circuit element layer DP-CL may include an insulation layer, a semiconductor pattern, a conductive pattern, and a signal line. The insulation layer, the semiconductor layer, and the conductive layer may be located on the substrate SUB in a manner such as coating, deposition, and the like. Thereafter, the insulation layer, the semiconductor layer, and the conductive layer may be selectively patterned through a plurality of photolithography processes to form the semiconductor pattern, the conductive pattern, and the signal line.

The circuit element layer DP-CL may include transistors constituted by the semiconductor pattern, the conductive pattern, and the signal lines. The display element layer DP-OLED may include light emitting elements connected to the transistors. The pixels PX may include the transistors and the light emitting elements.

The thin film encapsulation layer TFE may be located on the circuit element layer DP-CL to cover the display element layer DP-OLED. The thin film encapsulation layer TFE may include an inorganic layer, an organic layer, and an inorganic layer, which are sequentially laminated. Each of the inorganic layers may include an inorganic material and protect the pixels against moisture/oxygen. The organic layer may include an organic material and protect the pixels PX against foreign materials such as dust particles.

The input sensing part ISP may include a plurality of sensors for sensing an external input. The sensors may sense the external input in a capacitive manner. The external input may include various types of inputs such as a portion of the user's body, light, heat, a pen, or a pressure.

The input sensing part ISP may be directly manufactured on the thin film encapsulation layer TFE when the display panel DP is manufactured. However, the embodiments of the inventive concept are not limited thereto, and the input sensing unit ISP may be provided as a panel that is separated from the display panel DP and may be attached to the display panel DP by an adhesive layer.

Figure 14:
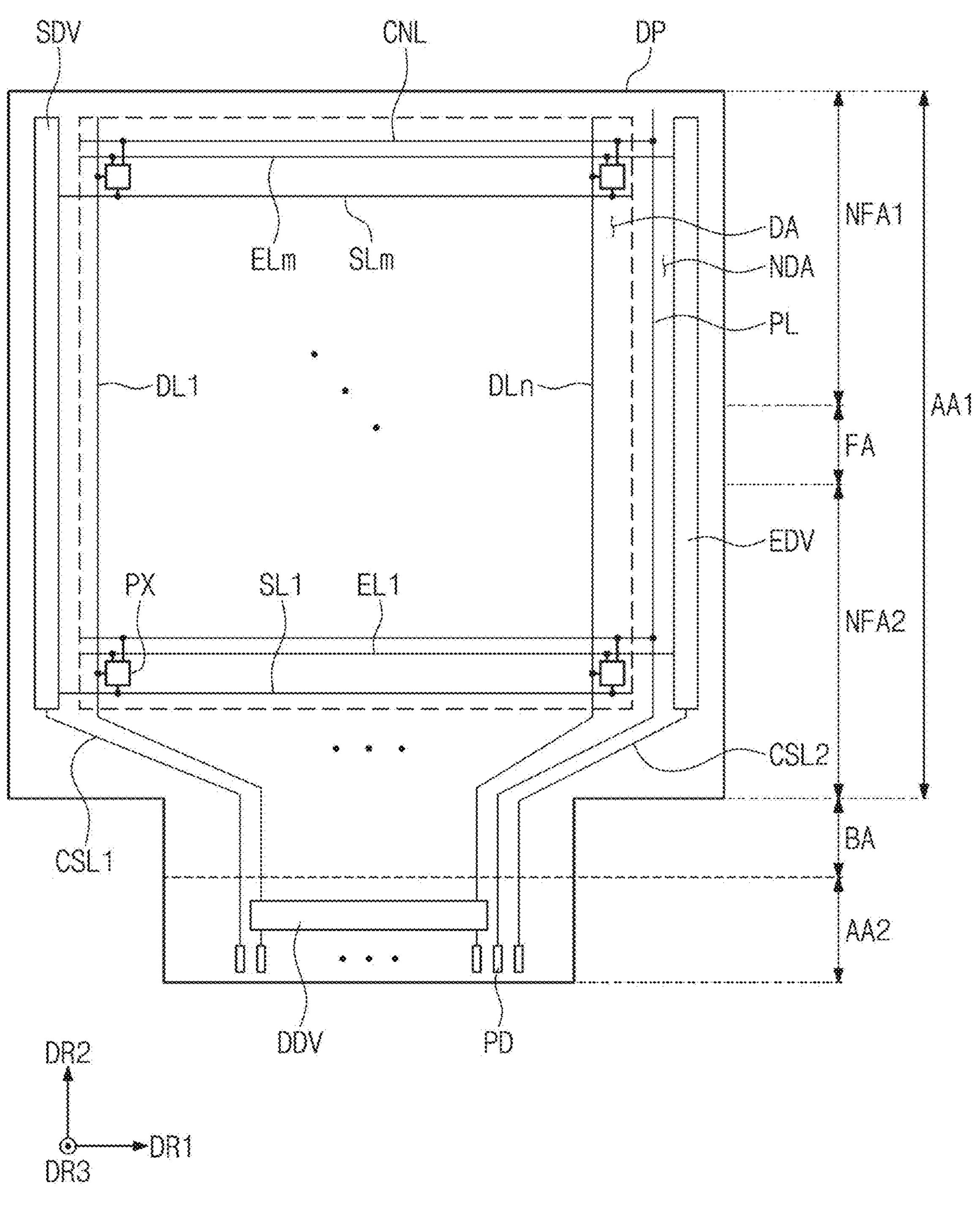
FIG. 14 is a plan view of the display panel of FIG. 12 according to some example embodiments.

FIG. 14 is a plan view of the display panel of FIG. 12.

Referring to FIG. 14, a scan driver SDV, a data driver DDV, and an emission driver EDV may be arranged on the display panel DP. The display panel DP may include a first area AA1, a second area AA2, and a bending area BA between the first area AA1 and the second area AA2. The bending area BA extends in the first direction DR1, and the first area AA1, the bending area BA, and the second area AA2 may be arranged in the second direction DR2.

The first area AA1 may include a display area DA and a non-display area NDA around the display area DA. The non-display area NDA may surround the display area DA. An image may be displayed on the display area DA but may not be displayed on the non-display area NDA. The second area AA2 and the bending area BA may be areas at which images are not displayed.

When viewed in the first direction DR1, the first area AA1 may include a first non-folding area NFA1, a second non-folding area NFA2, and a folding area FA located between the first non-folding area NFA1 and the second non-folding area NFA2.

The display panel DP includes a plurality of pixels PX, a plurality of scan lines SL1 to SLm, a plurality of data lines DL1 to DLn, a plurality of emission lines EL1 to ELm, first and second control lines CSL1 and CSL2, a power line PL, connection lines CNL, and a plurality of pads PD. Here, m and n are natural numbers. The pixels PX may be located in the display area DA and connected to the scan lines SL1 to SLm, the data lines DL1 to DLn, and the emission lines EL1 to ELm.

A scan driver SDV and an emission driver EDV may be located in the non-display area NDA. The scan driver SDV and the light emission driver EDV may be located in the non-display area NDA adjacent to both sides of the first area AA1, which are opposite to each other in the first direction DR1. The data driver DDV may be located in the second area AA2. The data driver DDV may be manufactured in the form of an integrated circuit chip and mounted on the second area AA2.

The scan lines SL1 to SLm may extend in the first direction DR1 and be connected to the scan driver SDV. The data lines DL1 to DLn may extend in the second direction DR2 and be connected to the data driver DDV via the bending area BA. The emission lines EL1 to ELm may extend in the first direction DR1 and be connected to a gate driver EDV.

The power line PL may extend in the second direction DR2 and may be located in the non-display area NDA. The power line PL may be located between the display area DA and the emission driver EDV, but embodiments according to the present disclosure are not limited thereto. For example, the power line PL may be located between the display area DA and the scan driver SDV.

The power line PL may extend to the second area AA2 via the bending area BA. The power line PL may extend toward a lower end of the second area AA2 when viewed on a plane (or in a plan view). The power line PL may receive a driving voltage.

The connection lines CNL may extend in the second direction DR2 and may be arranged in the first direction DR1. The connection lines CNL may be connected to the power line PL and the pixels PX. The driving voltage may be applied to the pixels PX through the power line PL and the connection lines CNL, which are connected to each other.

The first control line CSL1 may be connected to the scan driver SDV and extend toward the lower end of the second area AA2 via the bending area BA. The second control line CSL2 may be connected to the emission driver EDV and extend toward the lower end of the second area AA2 via the bending area BA. The data driver DDV may be located between the first control line CSL1 and the second control line CSL2.

When viewed on the plane (or in a plan view), the pads PD may be arranged adjacent to the lower end of the second area AA2. The data driver DDV, the power line PL, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data drivers DDV may be connected to the pads PD, which respectively correspond to the data lines DL1 to DLn.

According to some example embodiments, a printed circuit board connected to the pads PD may be provided. A timing controller and a voltage generator may be located on the printed circuit board. The timing controller may be manufactured as an integrated circuit chip and mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from the outside. The voltage generator may generate the driving voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside and convert a data format of the image signals to match an interface specification with the data driver DDV and thus provide the converted data format to the data driver DDV.

The scan driver SDV may generate a plurality of scan signals in response to the scan control signal. The scan signals may be applied to the pixels PX through the scan lines SL1 to SLm. The scan signals may be sequentially applied to the pixel PX.

The data driver DDV may generate a plurality of data voltages corresponding to the image signals in response to the data control signal. The data voltages may be provided to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. An emission time of the pixels PX may be controlled by the emission signals.

Figure 15:
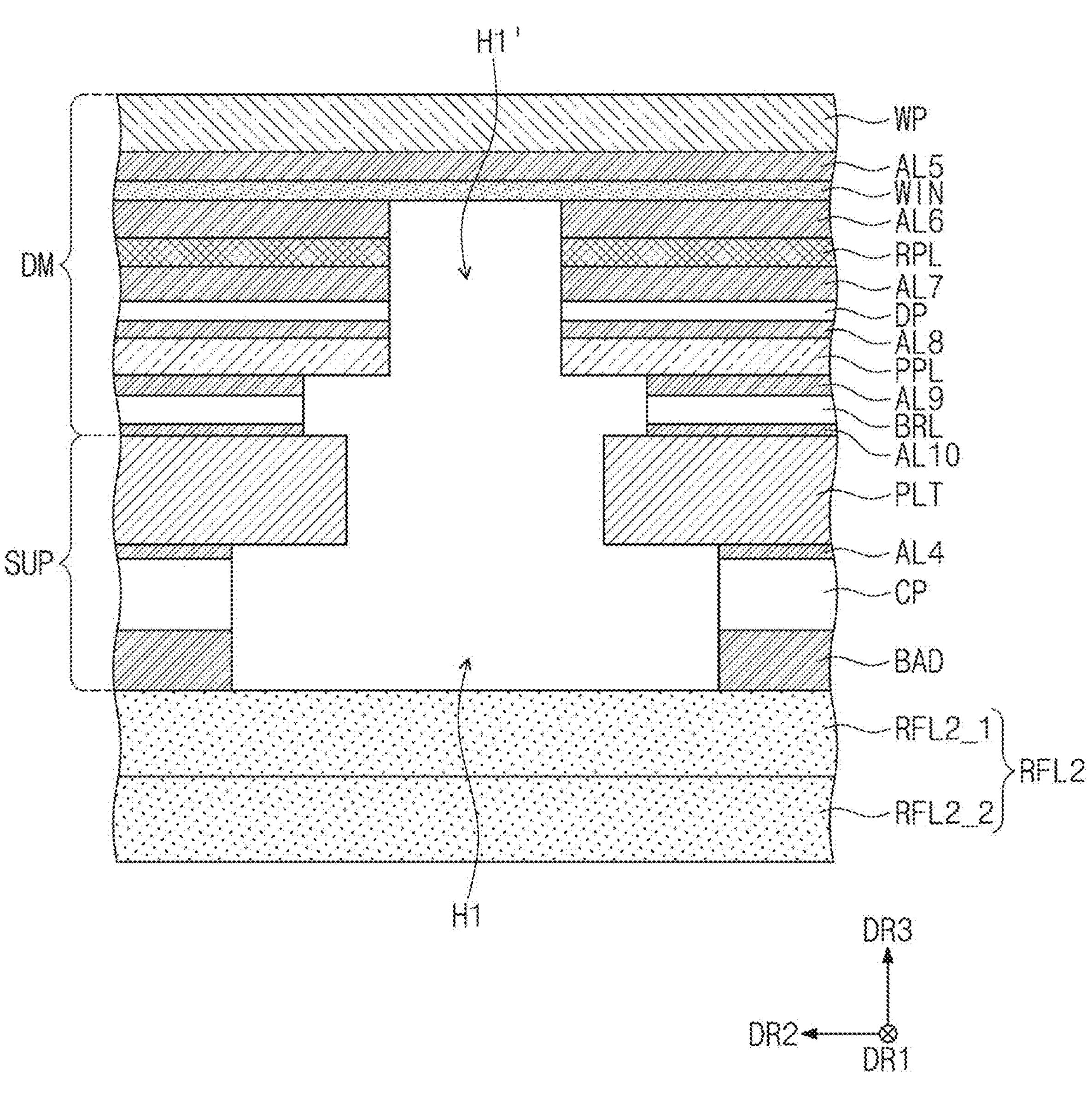
FIG. 15 is a cross-sectional view illustrating a periphery of a first hole of the display module bonded to the support of FIG. 12 *v* according to some example embodiments.
Figure 16:
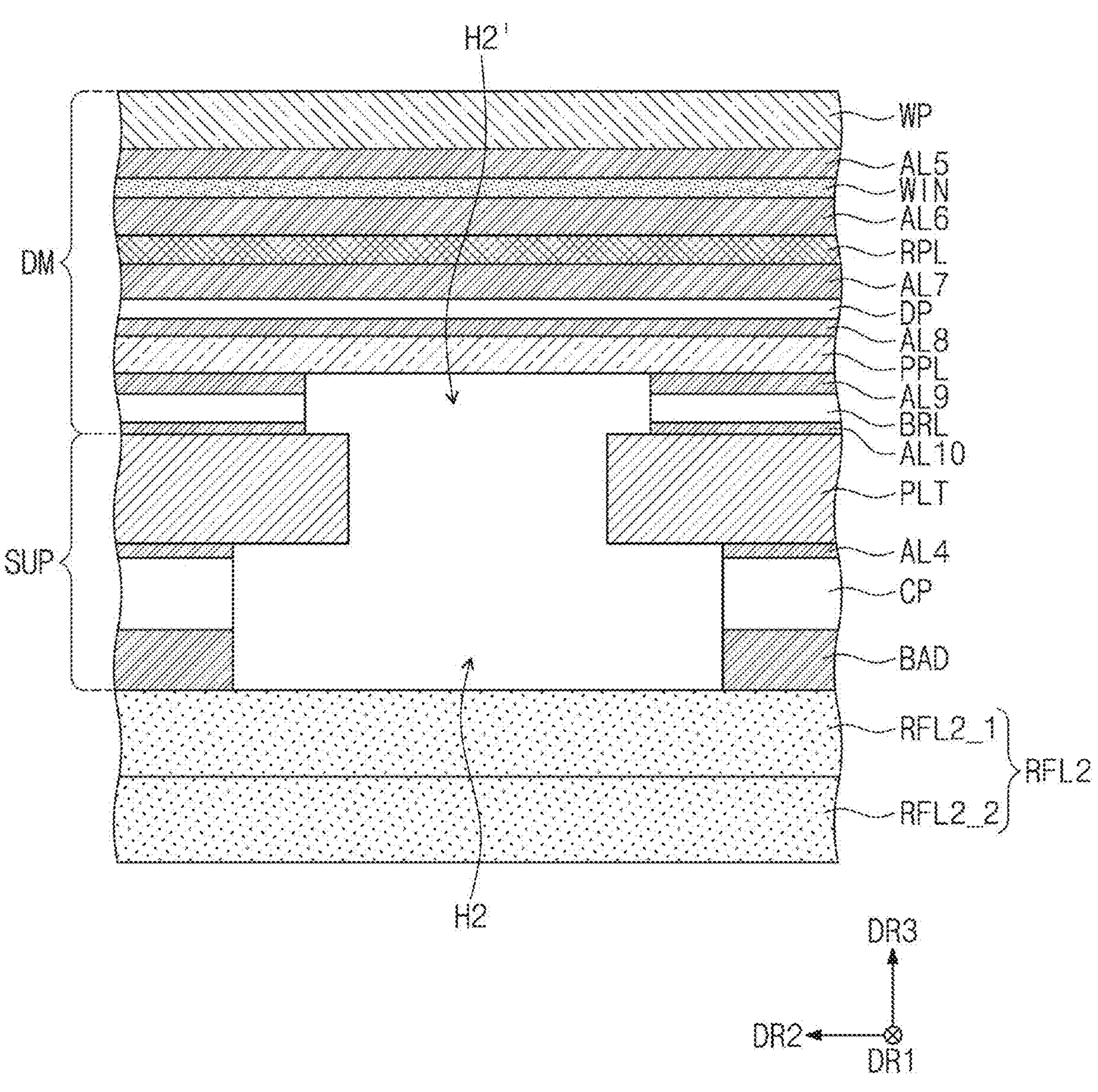
FIG. 16 is a cross-sectional view illustrating a periphery of a second hole of the display module bonded to the support of FIG. 12 according to some example embodiments.

FIG. 15 is a cross-sectional view illustrating a periphery of a first hole of the display module bonded to the support of FIG. 12. FIG. 16 is a cross-sectional view illustrating a periphery of a second hole of the display module bonded to the support of FIG. 12.

For example, FIG. 15 is a cross-sectional view corresponding to FIG. 9, and FIG. 16 is a cross-sectional view corresponding to FIG. 10.

Referring to FIG. 15, a first hole H1' corresponding to the first hole H1 defined in the support SUP may be defined in the display module DM. The first hole H1' may be defined below the window WIN. The first hole H1' may be defined in the anti-reflection layer RPL, the display panel DP, the panel protection layer PPL, the barrier layer BRL, and the sixth to tenth adhesive layers AL6 to AL10.

A width of the first hole H1' defined in the barrier layer BRL and the ninth and tenth adhesive layers AL9 and AL10 may be greater than that of the first hole H1' defined in the antireflection layer RPL, the display panel DP, the panel protection layer PPL, and the sixth to eighth adhesive layers AL6 to AL8 in the first and second directions DR1 and DR2.

A width of the first hole H1' defined in the anti-reflection layer RPL, the display panel DP, the panel protection layer PPL, and the sixth to eighth adhesive layers AL6 to AL8 may be less than that of the first hole H1 defined in the first plate PLT1 in the first and second directions DR1 and DR2.

A width of the first hole H1' defined in the barrier layer BRL and the ninth and tenth adhesive layers AL9 and AL10 may be greater than that of the first hole H1 defined in the first plate PLT1 in the first and second directions DR1 and DR2. The width of the first hole H1' defined in the barrier layer BRL and the ninth and tenth adhesive layers AL9 and AL10 may be less than that of the first hole H1 defined in the edge adhesive layer BAD, the step compensation layer CP, and the fourth adhesive layer AL4.

When viewed on the plane (or in a plan view), the first hole H1' may overlap the first hole H1. According to some example embodiments, the camera CAM may be located in the first hole H1' and the first hole H1 in following processes.

Referring to FIG. 16, a second hole H2' corresponding to the second hole H2 defined in the support unit SUP may be defined in the display module DM. The second hole H2' may be defined below the panel protection layer PPL. The second hole H2' may be defined in the barrier layer BRL and the ninth and tenth adhesive layers AL9 and AL10.

A width of the second hole H2' defined in the barrier layer BRL and the ninth and tenth adhesive layers AL9 and AL10 may be greater than that of the second hole H2 defined in the first plate PLT1 in the first and second directions DR1 and DR2. The width of the second hole H2' defined in the barrier layer BRL and the ninth and tenth adhesive layers AL9 and AL10 may be less than that of the second hole H2 defined in the edge adhesive layer BAD, the step compensation layer CP, and the fourth adhesive layer AL4.

When viewed on the plane (or in a plan view), the second hole H2' may overlap the second hole H2. According to some example embodiments, the sensor SN may be located in the second hole H2' and the second hole H2 in following processes.

FIGS. 17 to 20 are cross-sectional views taken along the line IV-IV' of FIG. 7, which are views for explaining a method for inspecting the first hole of FIG. 15.

For example, in FIGS. 17 to 20, the display module DM and the support SUP located below the second release film RFL2 are illustrated together with the second release film RFL2. In addition, for convenience of description, in FIGS. 17 to 20, the display module DM and the support unit SUP are illustrated as a single layer, and first holes H1 and H1' are illustrated in the display module DM and the support SUP, which are illustrated as the single layer.

Figure 17:
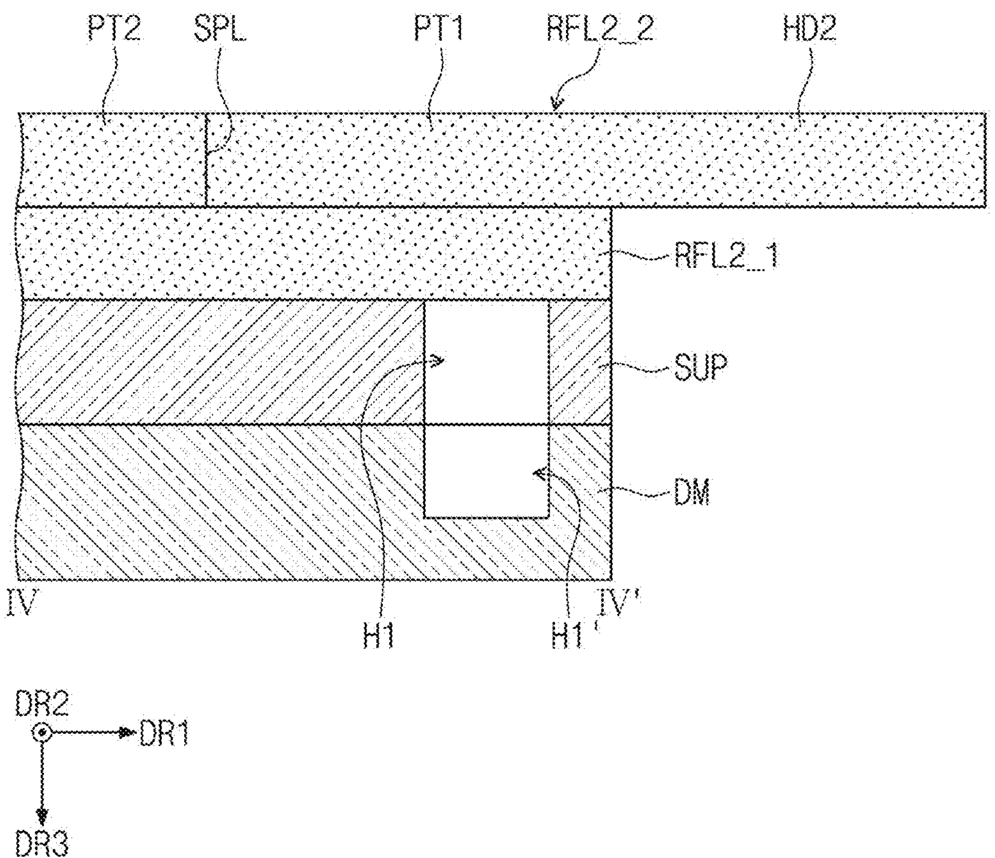
FIGS. 17 to 20 are cross-sectional views taken along the line IV-IV' of FIG. 7, which are views for explaining a method for inspecting the first hole of FIG. 15 according to some example embodiments.

Referring to FIG. 17, the support SUP may be located on the display module DM, and a first sub release film RFL2_1 may be located on the support SUP. A second sub release film RFL2_2 may be located on the first sub release film RFL2_1. A second handle HD2 of the second sub release film RFL2_2 may protrude outside the support SUP. The second handle HD2 may protrude outside the first sub release film RFL2_1. Therefore, the second handle HD2 may be easily gripped.

The first portion PT1 may overlap the first hole H1 and the first hole H1'. The first portion PT1 may be located on the first hole H1. The second handle HD2 may extend from the first portion PT1.

Figure 18:
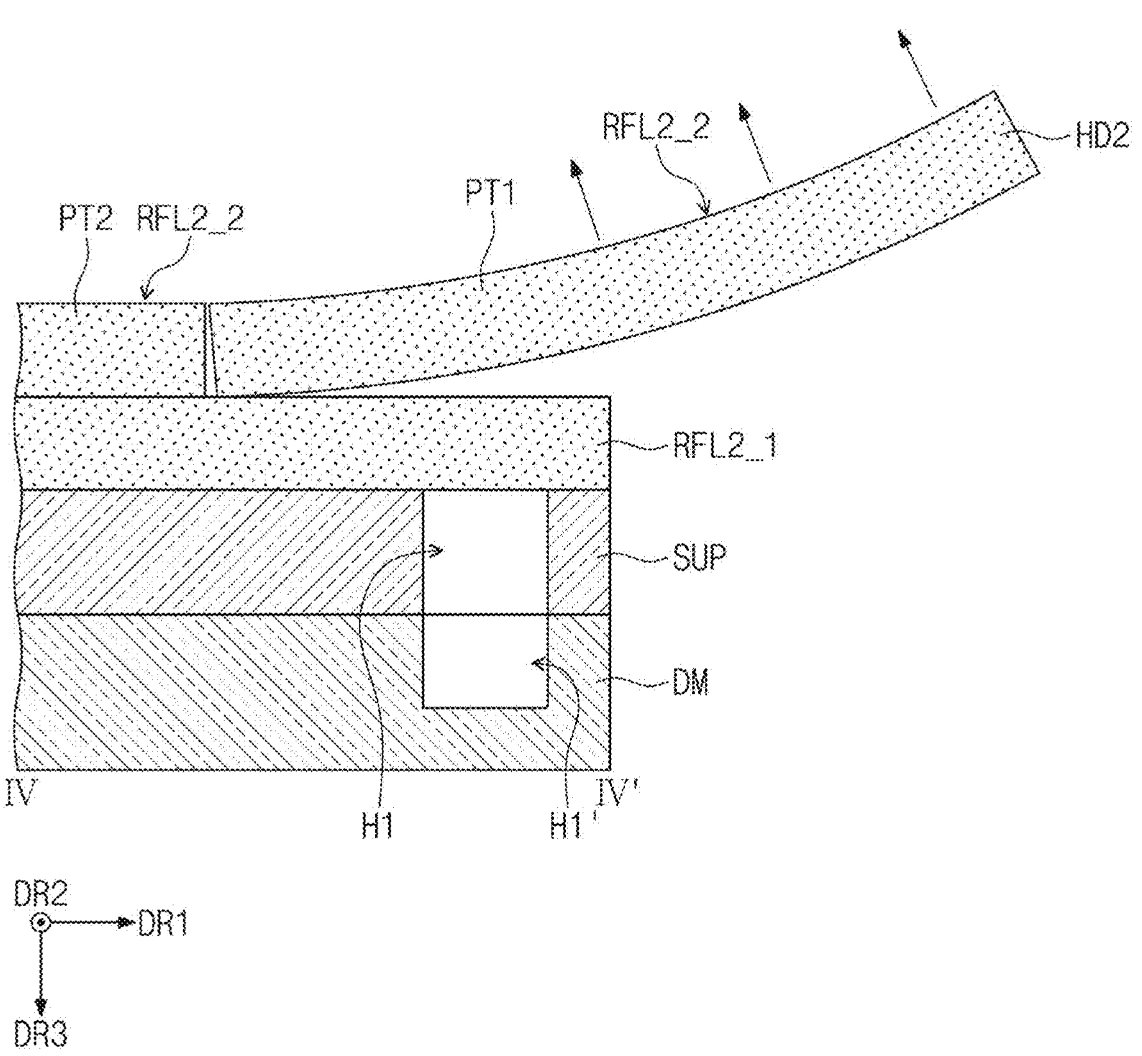

Referring to FIG. 18, the first portion PT1 may be delaminated from the first sub release film RFL2_1 by using the second handle HD2. The second handle HD2 is lifted upward, and the first portion PT1 may be separated from the separation line SPL. Thus, the first portion PT1 may be separated from the second portion PT2 and detached from the first sub release film RFL2_1.

Figure 19:
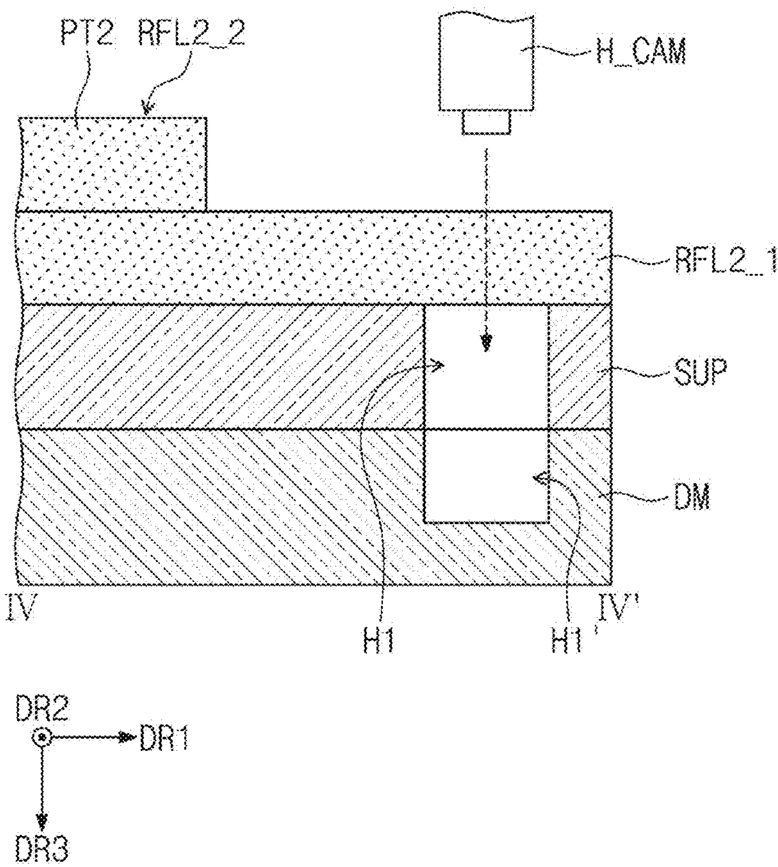

Referring to FIG. 19, the first portion PT1 may be temporarily removed, and a camera H_CAM for inspecting the hole may be located on the support SUP. The camera H_CAM may be located at the first holes H1 and H1'. The camera H_CAM may be located on the first sub release film RFL2_1 overlapping the first holes H1 and H1'. Because the first sub release film RFL2_1 has a property of transmitting light, the camera H_CAM may photograph the first hole H1 and the first hole H1'.

The first hole H1 and the first hole H1' may be inspected by the camera H_CAM. For example, whether the first hole H1 is normally aligned with the first hole H1' may be inspected by the camera H_CAM. In addition, whether foreign substances exist in the first hole H1 and the first hole H1' may be inspected by the camera H_CAM.

If the first portion PT1 is not removed, the first and second sub release films RFL2_1 and RFL2_2 may be formed as two release films between the camera H_CAM and the support SUP. Because light transmittance is deteriorated by the first and second sub release films RFL2_1 and RFL2_2, it may be difficult to normally photograph the first hole H1 and the first hole H1' through the camera H_CAM.

According to some example embodiments of the inventive concept, when the first hole H1 and the first hole H1' are inspected by the camera H_CAM, the first portion PT1 of the second sub release film RFL2_2 may be removed. Thus, the first hole H1 and the first hole H1' may be more easily inspected by the camera H_CAM.

Figure 20:
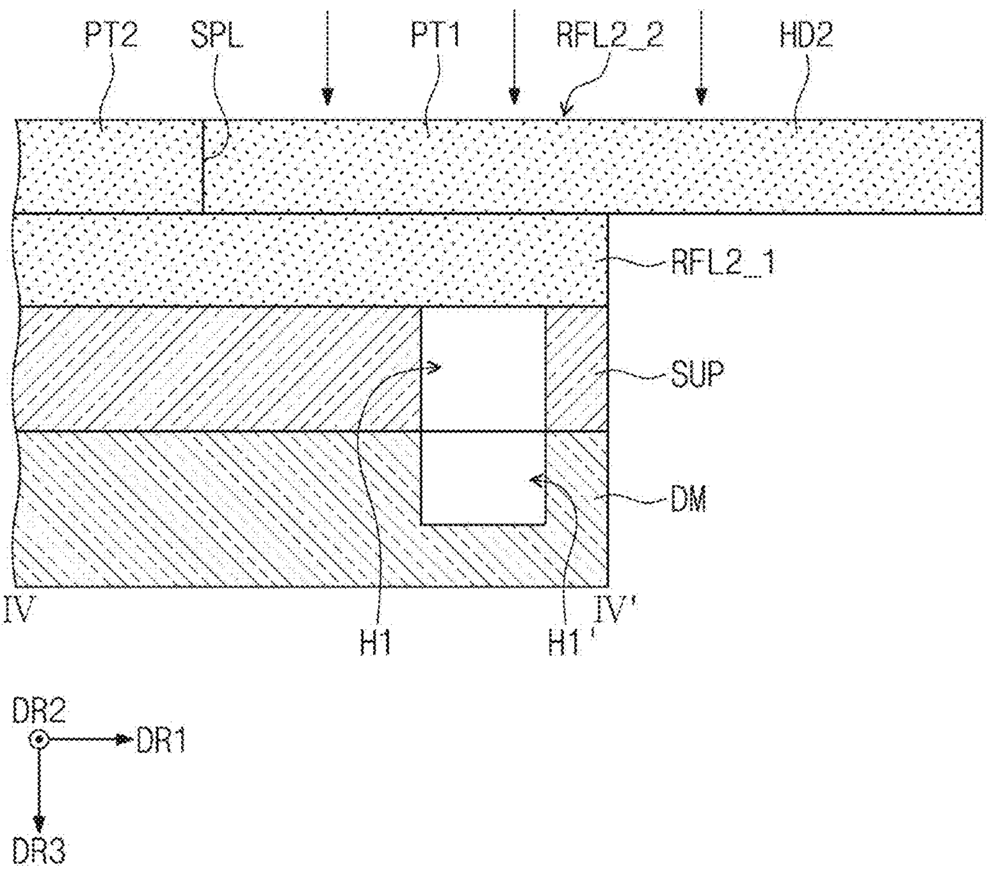

Referring to FIG. 20, after the first holes H1 and H1' are inspected by the camera H_CAM, the temporarily removed first portion PT1 may be located at the first holes H1 and H1' and then may be attached again to the first sub release film RFL2_1. Thereafter, the support unit SUP and the display module DM may be transferred to the next process.

Figure 21:
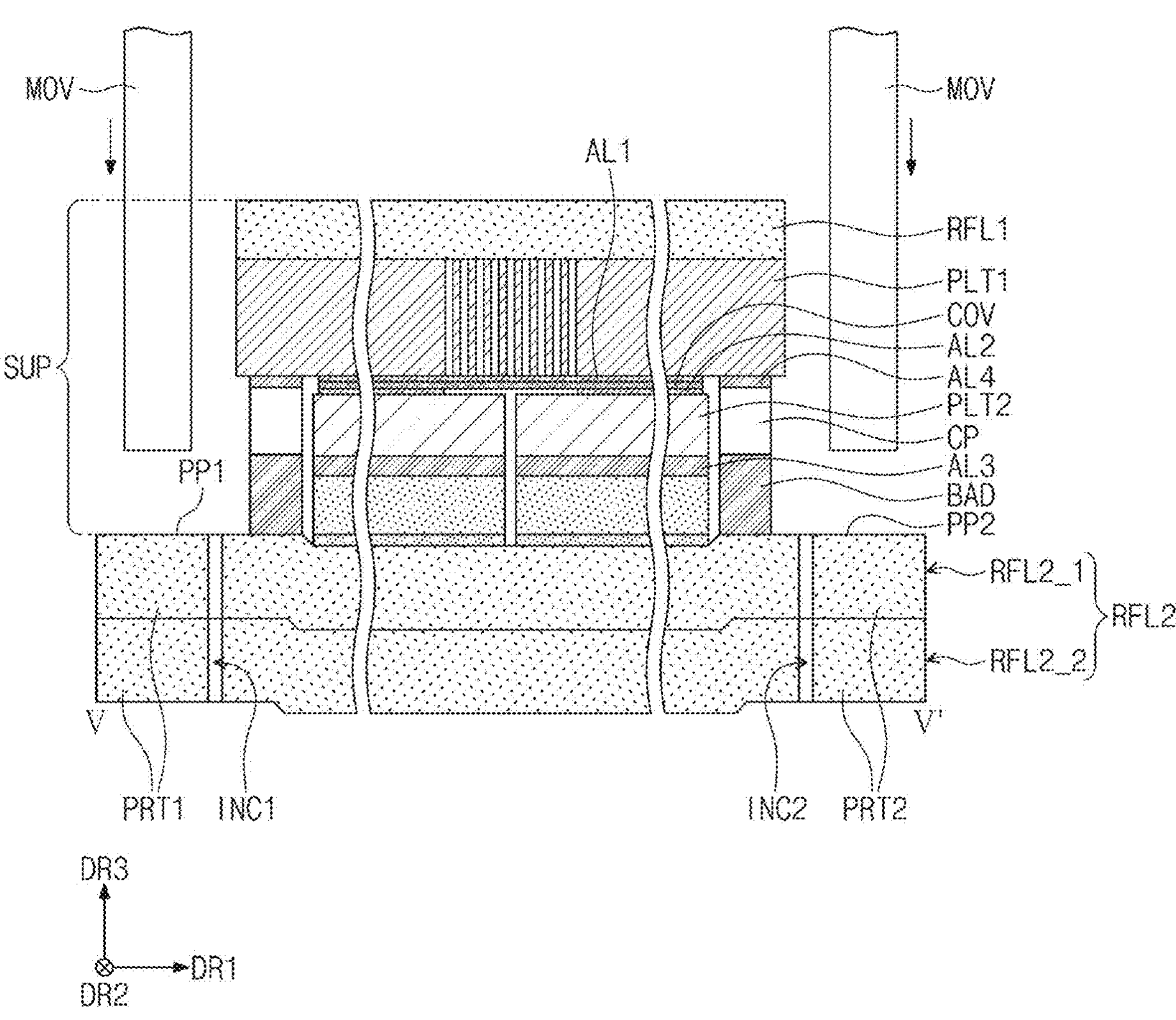
FIGS. 21 and 22 are cross-sectional views taken along the line V-V' of FIG. 6, which are views for explaining a process of transferring the support according to some example embodiments.
Figure 22:
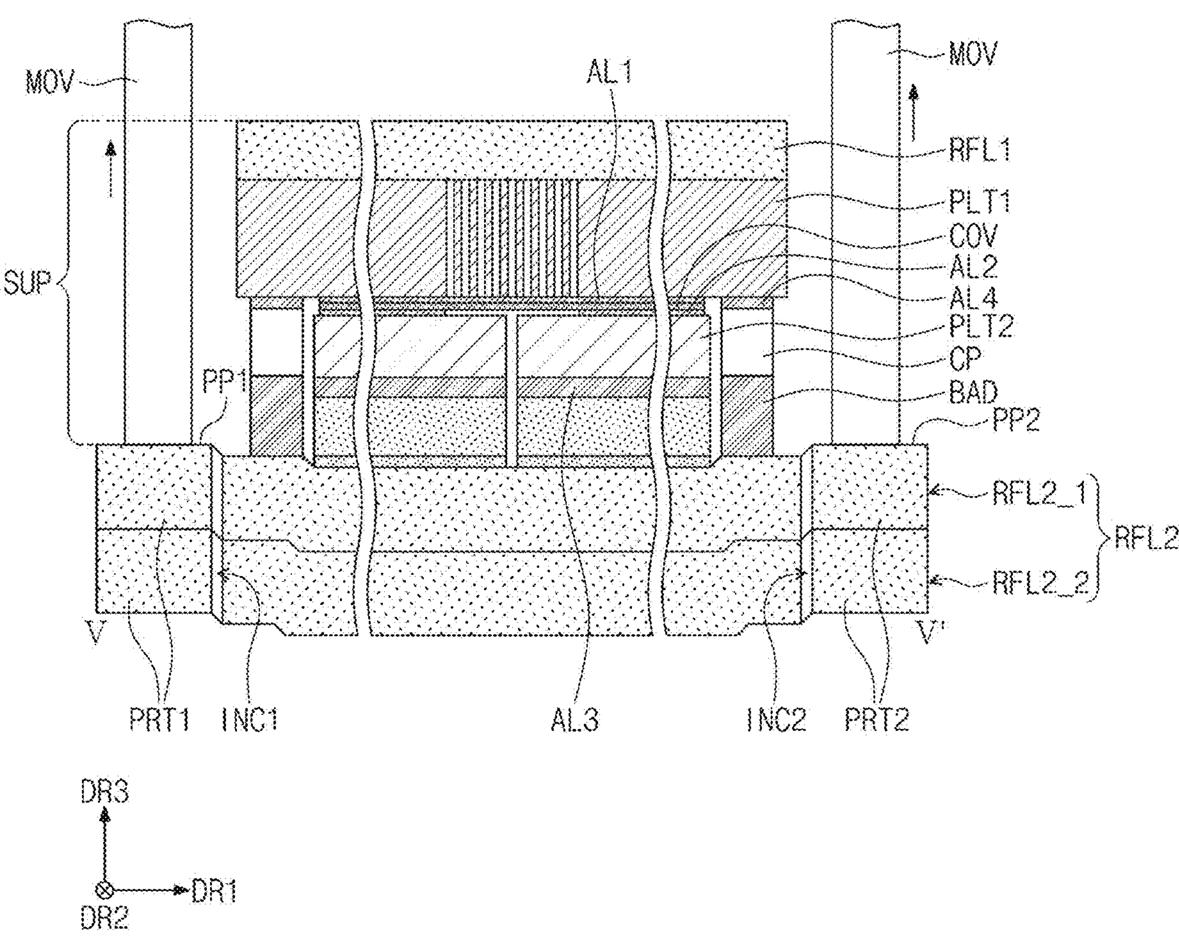

FIGS. 21 and 22 are cross-sectional views taken along the line V-V' of FIG. 6, which are views for explaining a process of transferring the support.

For example, FIGS. 21 and 22 illustrate cross-sectional views of the support SUP and the first and second release films RFL1 and RFL2.

Referring to FIG. 21, a first cutoff part INC1 may be defined in the first and second sub release films RFL2_1 and RFL2_2. A second cutoff part INC2 may be defined in the first and second sub release films RFL2_1 and RFL2_2.

A portion of the first protrusion PRT1 spaced apart from the support SUP rather than the first cutoff part INC1 may be defined as a first flat portion PP1 and may be in a flat state. A portion of the second protrusion PRT2 spaced apart from the support SUP rather than the second cutoff part INC2 may be defined as a second flat portion PP2 and may be in a flat state.

The first flat portion PP1 may be defined as a portion of the first protrusion PRT1 located outside the first cutoff part INC1. The second flat portion PP2 may be defined as a portion of the second protrusion PRT2 located outside the second cutoff part portion INC2.

The transfer parts MOV for transferring the support SUP may be located at the first and second protrusions PRT1 and PRT2. Transfer parts MOV may be located at the first and second flat portions PP1 and PP2, respectively.

Referring to FIG. 22, the transfer parts MOV may move downward to adsorb the first and second flat portions PP1 and PP2, respectively. The transport parts MOV may be adsorbed to the first and second flat portions PP1 and PP2 in a vacuum adsorption manner. For example, holes are defined in the transfer parts MOV, and adsorption force may be provided while the holes are maintained in a vacuum state.

The transfer parts MOV may adsorb the first and second flat portions PP1 and PP2 to transfer the second release film RFL2. Thus, the support SUP and the first release film RFL1 located on the second release film RFL2 may be transferred by the transfer parts MOV. For example, the support SUP may be transferred to a process chamber for attaching the display module DM illustrated in FIGS. 11 and 12 to the support SUP by the transfer parts MOV.

Figure 23:
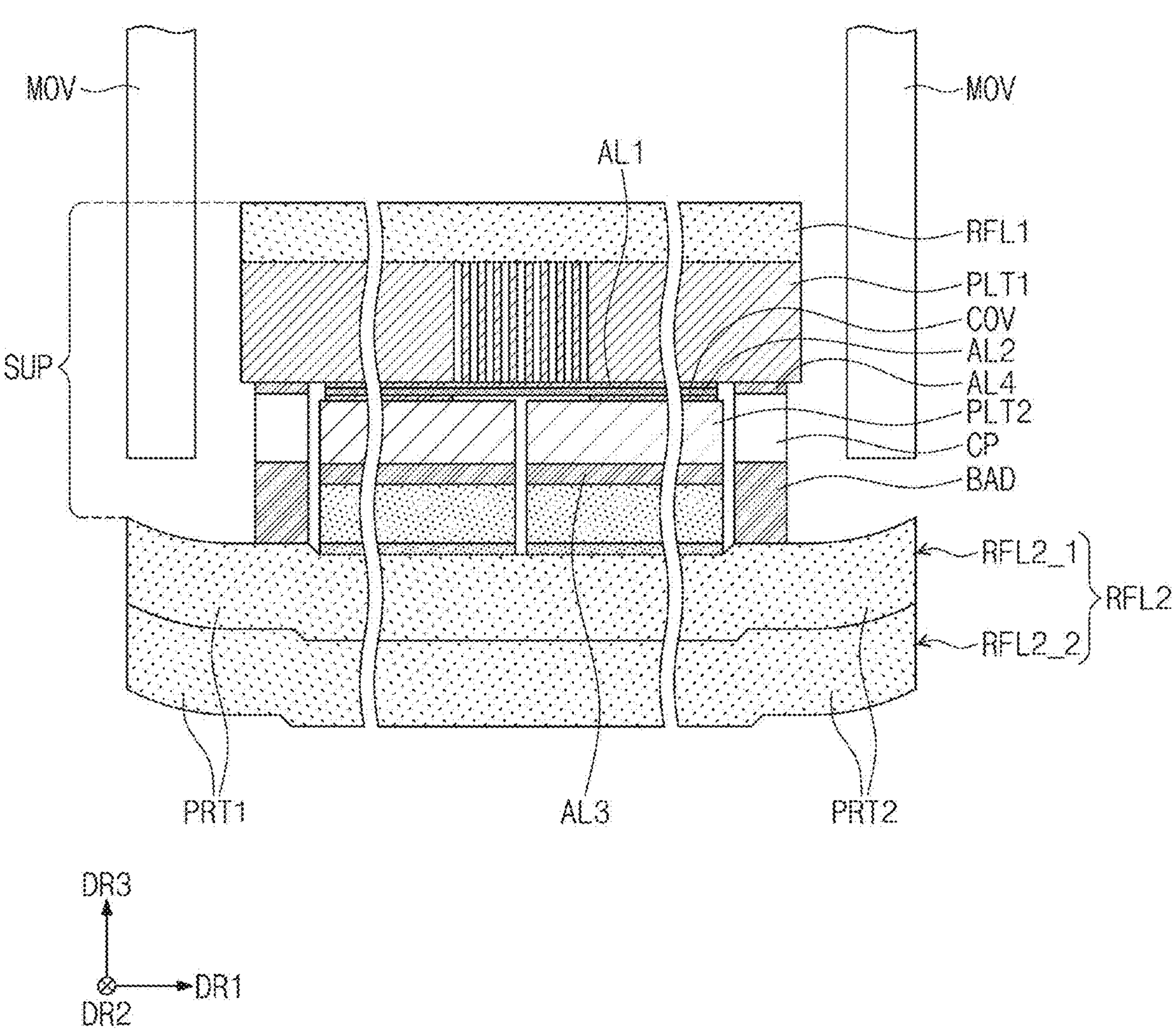
FIG. 23 is a view of a second release film on which first and second cutoff parts are not formed according to some example embodiments.

FIG. 23 is a view of the second release film on which first and second cutoff parts are not formed.

For example, FIG. 23 illustrates a cross-sectional view corresponding to FIG. 21.

Referring to FIG. 23, the first and second protrusions PRT1 and PRT2 located outside the support SUP are not attached to the support SUP. In this case, stress in which ends of the first and second protrusions PRT1 and PRT2 tend to be rolled upward may occur. Due to the stress, as illustrated in FIG. 23, the first and second protrusions PRT1 and PRT2 may be bent upward.

The transfer parts MOV may be located on the first and second protrusions PRT1 and PRT2. When each of the first and second protrusions PRT1 and PRT2 are in the flat state, the transfer parts MOV may adsorb the first and second protrusions PRT1 and PRT2. However, when the first and second protrusions PRT1 and PRT2 are bent, the transfer parts MOV may not be able to adsorb the bent first and second protrusions PRT1 and PRT2. Thus, the transfer parts MOV may not be able to transport the support unit SUP.

Referring to FIG. 21, the first and second cutoff parts INC1 and INC2 may be defined in portions of the first and second protrusions PRT1 and PRT2 adjacent to the support SUP, respectively. In this case, stress on the first and second protrusions PRT1 and PRT2 may be reduced.

As the stress decreases, portions of the first and second protrusions PRT1 and PRT2 located outside the first and second cutoff parts INC1 and INC2 may be flatter. Thus, the flat first and second flat portions PP1 and PP2 are formed, and the transfer portions MOV may absorb the first and second flat portions PP1 and PP2 to transfer the support SUP.

Figure 24:
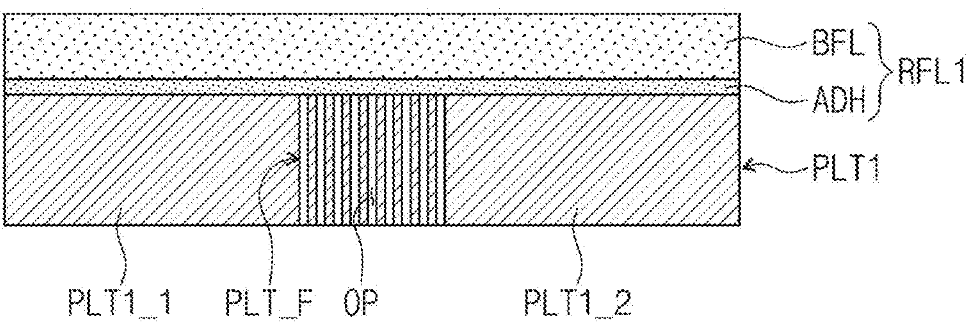
FIG. 24 is a view illustrating a lamination structure of the first release film of FIG. 8 according to some example embodiments.

FIG. 24 is a view illustrating a lamination structure of the first release film of FIG. 8.

For example, in FIG. 24, the first plate PLT1 is illustrated together with the first release film RFL1.

Referring to FIG. 24, the first release film RFL1 may include a base film BFL and an adhesive layer ADH located between the base film BFL and the first plate PLT1. The adhesive layer ADH may be formed on a bottom surface of the base film BFL. The adhesive layer ADH may include a urethane adhesive.

The first release film RFL1 may be attached to the first plate PLT1 by the adhesive layer ADH. As illustrated in FIG. 11, to attach the display module DM to the support SUP, the first release film RFL1 may be removed.

If the adhesive layer ADH contains a silicone adhesive, when the first release film RFL1 is removed, properties of the silicone adhesive may be transferred to the top surface of the first plate PLT1, and an oil film may be formed on the top surface of the first plate PLT1. When the display module DM is attached to the top surface of the first plate PLT1, adhesive force between the display module DM and the first plate PLT1 may decrease due to the oil film.

When the adhesive layer ADH containing the urethane adhesive is used, the adhesive force between the display module DM and the first plate PLT1 may be strengthened. According to some example embodiments of the inventive concept, the adhesive layer ADH may have a thickness of about 7 micrometers (μm) to about 10 micrometers (μm). In addition, the adhesive layer ADH may have adhesive force of about 8 gf to about 12 gf.

Table 1 below shows experimental results using the urethane adhesive and the silicone adhesive. Table 1 shows an example in which a release film using the urethane adhesive is removed from the first plate PLT1, and then, a conductive tape is attached to the first plate PLT1 to measure adhesive force of the conductive tape. In addition, Table 1 shows results of a test in which a release film using the silicon adhesive is removed from the first plate PLT1, and then, a conductive tape is attached to the first plate PLT1 to measure adhesive force of the conductive tape.

In Table 1, "the number of times" indicates the number of experiments, and "before attaching" indicates test results obtained by measuring adhesive force of the conductive tape after attaching only the conductive tape to the first plate PLT1 without attaching the release film to the first plate PLT1. Table 1, "immediate removal" indicates test results obtained by measuring adhesive force of the conductive tape when the conductive tape is attached to the first plate PLT1 after immediately removing the release films just after attaching the release film using the urethane adhesive and the release film using the silicon adhesive to the first plate PLT1.

In Table 1, a time represents a time elapsed after attaching the release film using the urethane adhesive and the release film using the silicone adhesive to the first plate PLT1. In Table 1, "after a set or predetermined time elapses" indicates test results obtained by measuring adhesive force of the conductive tape by attaching the conductive tape to the first plate PLT1 after removing the release film using the urethane adhesive and the release film using the silicon adhesive from the first plate PLT1.

TABLE 1

| | Test results of adhesive force of conductive tape (gf/in) | | | | | | |
|---|---|---|---|---|---|---|---|
| Products | Number of times | Before attaching | Immediate removal | 30 minutes | 24 hours | 48 hours | 72 hours |
| Urethane Adhesive | 1 | 1023 | 984 | 1090 | 1151 | 948 | 990 |
| | 2 | 1081 | 1018 | 1089 | 1111 | 1014 | 1024 |
| | 3 | 1043 | 1000 | 1101 | 1113 | 1019 | 1095 |
| | Mean | 1049.00 | 1000.67 | 1093.33 | 1125.0 | 993.67 | 1036.33 |
| Silicon Adhesive | 1 | 1023 | 1014 | 904 | 460 | 441 | 473 |
| | 2 | 1081 | 1017 | 889 | 446 | 440 | 469 |
| | 3 | 1043 | 959 | 904 | 439 | 444 | 452 |
| | Mean | 1049.00 | 996.67 | 899.00 | 448.33 | 441.67 | 464.67 |

Referring to Table 1, it may be seen that the adhesive force of the conductive tape on the first plate PLT1 when the urethane adhesive is used is greater than that of the conductive tape when the silicon adhesive is used, as shown in the mean value of the experimental results. That is, after removing the release film using the urethane adhesive from the first plate PLT1, when the display module DM is attached to the first plate PLT1, the display module DM may be more strongly attached than the first plate PLT1.

The urethane adhesive may be cheaper than the silicone adhesive. When the release film including the urethane adhesive is used, manufacturing costs of the display device may be reduced.

Figure 25:
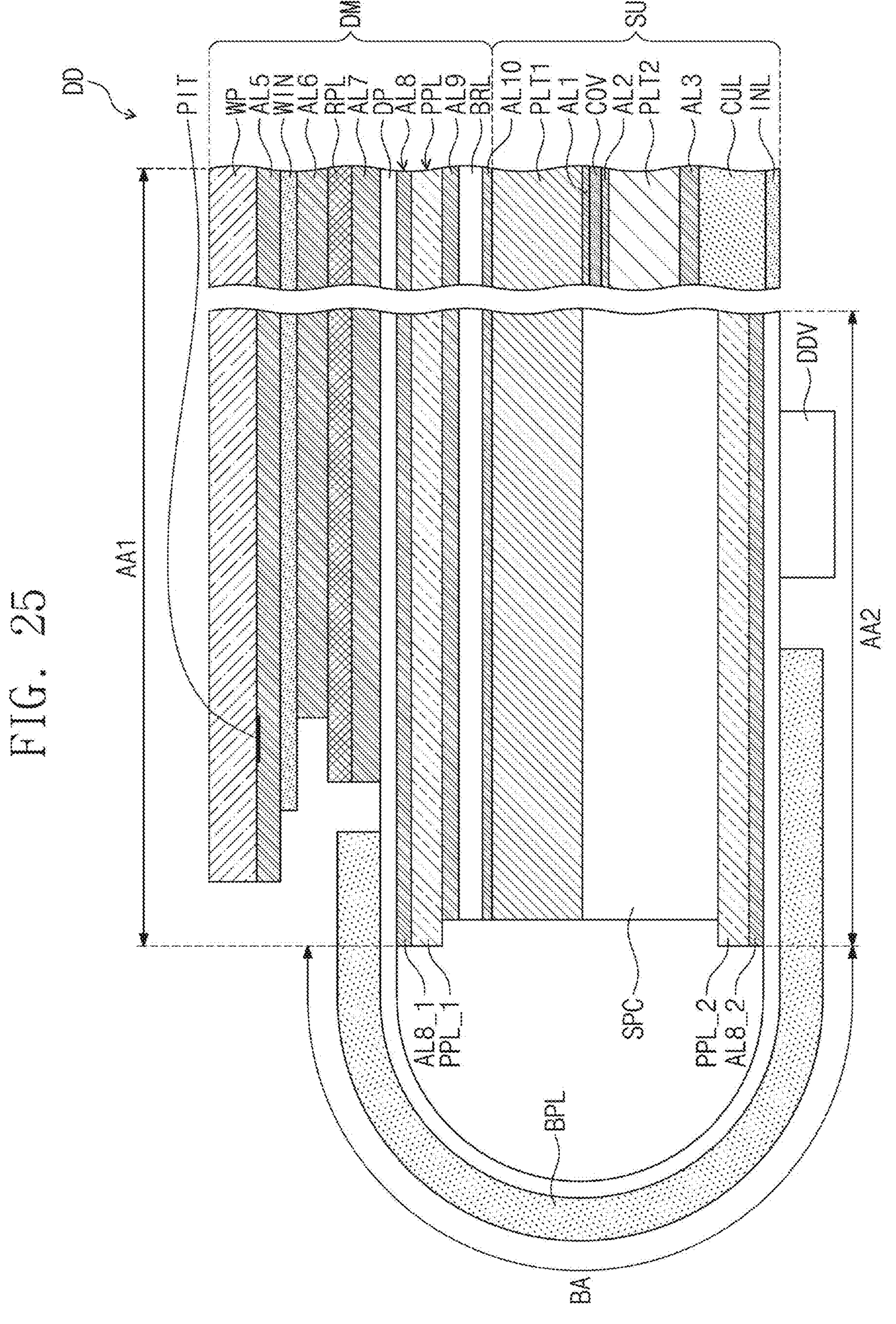
FIG. 25 is a view illustrating a state in which the display panel of FIG. 12 is bent according to some example embodiments.

FIG. 25 is a view illustrating a state in which the display panel of FIG. 12 is bent.

Referring to FIG. 25, the second and third release films RFL2 and RFL3 illustrated in FIG. 12 may be removed, and the bending area BA may be bent, and thus, the second area AA2 may be formed below the first area AA1. Therefore, the data driver DDV may be formed below the first area AA1.

A spacer SPC may be located at a portion from which the third release film RFL3 is removed. The spacer SPC may be located below the first plate PLT1. The second portion PPL_2 of the panel protection layer PPL may be located below the spacer SPC.

The spacer SPC may be a double-sided tape. For example, the spacer SPC may include a base layer such as flexible polyethylene terephthalate and an adhesive formed on top and bottom surfaces of the base layer. The second portion PPL_2 of the panel protection layer PPL may be attached to the spacer SPC. Therefore, the display device DD of FIG. 22 may be manufactured.

The display device DD may include a protection layer BPL. The protection layer BPL may be formed at the bending area BA, a portion of the first area AA1 adjacent to the bending area BA, and a portion of the second area AA2 adjacent to the bending area BA. The protection layer BPL may continuously extend from a portion of the first area AA1 adjacent to the bending area BA to the bending area BA and a portion of the second area AA2 adjacent to the bending area BA.

The protection layer BPL may serve to protect the bending area BA. The protection layer BPL may cover lines formed at the bending area BA to protect the lines formed at the bending area BA. The protection layer BPL may complement stiffness of the bending area BA, and when the bending area BA is bent, the bending area BA may be prevented from being cracked. The protection layer BPL may protect the bending area BA against an external impact.

According to some example embodiments of the inventive concept, when the display device is manufactured, a portion of the second release film overlapping the first hole defined in the display module and the support may be removed to inspect the first hole by using the camera. Therefore, the first hole may be more easily inspected.

In addition, the cutoff parts may be defined in the protrusions of the second release film protruding outside the support. The transfer parts for transferring the support may more easily transfer the support by adsorbing the portions of the second release films located outside the cutoff parts.

It will be apparent to those skilled in the art that various modifications and variations can be made in the present invention. Thus, it is intended that the present invention covers the modifications and variations of this invention provided they come within the scope of the appended claims and their equivalents. Thus, to the maximum extent allowed by law, the scope of embodiments according to the present invention is to be determined by the broadest permissible interpretation of the following claims and their equivalents, and shall not be restricted or limited by the foregoing detailed description.

What is claimed is:

1. A hole inspection method comprising:

arranging a second sub release film on a first sub release film, the second sub release film comprising a first portion and a second portion around the first portion, on a support;

arranging the support on a display module;

detaching the first portion, which overlaps a first hole defined in the display module and the support, from the first sub release film;

arranging a camera on the first sub release film overlapping the first hole; and inspecting the first hole through the camera.

2. The hole inspection method of claim 1, further comprising, after inspecting the first hole, attaching the first portion to the first sub release film.

3. The hole inspection method of claim 1, wherein the second sub release film further comprises a handle extending from the first portion, and the handle protrudes outside the first sub release film and the support.

4. The hole inspection method of claim 3, wherein the first portion is detached from the first sub release film and separated from the second portion by using the handle.

* * * * *